(12) United States Patent
Kurosaki et al.

(10) Patent No.: US 7,196,376 B2
(45) Date of Patent: Mar. 27, 2007

(54) TRENCH-TYPE POWER MOSFET WITH EMBEDDED REGION AT THE BOTTOM OF THE GATE AND INCREASED BREAKDOWN VOLTAGE

(75) Inventors: Toru Kurosaki, Saitama (JP); Shinji Kunori, Saitama (JP); Mizue Kitada, Saitama (JP); Kosuke Ohshima, Saitama (JP); Hiroaki Shishido, Saitama (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 11/097,998

(22) Filed: Apr. 4, 2005

(65) Prior Publication Data

US 2005/0224848 A1 Oct. 13, 2005

Related U.S. Application Data

(63) Continuation of application No. PCT/JP03/12573, filed on Oct. 1, 2003.

(30) Foreign Application Priority Data

Oct. 4, 2002 (JP) .............................. 2002-291841
Sep. 12, 2003 (JP) .............................. 2003-320838

(51) Int. Cl.
*H01L 29/78* (2006.01)

(52) U.S. Cl. ................. 257/341; 257/330; 257/E29.257

(58) Field of Classification Search ........ 257/329–343, 257/401, E29.257
See application file for complete search history.

(56) References Cited

U.S. PATENT DOCUMENTS

| 6,194,741 B1 * | 2/2001 | Kinzer et al. ................. 257/77 |
| 6,991,977 B2 * | 1/2006 | Kocon ......................... 438/206 |
| 2003/0042555 A1 * | 3/2003 | Kitada et al. ............... 257/401 |

FOREIGN PATENT DOCUMENTS

| JP | 5-7002 | 1/1993 |
| JP | 11-87698 | 3/1999 |
| JP | 2000-216381 | 8/2000 |
| JP | 2001-267570 | 9/2001 |
| JP | 2003-69017 | 3/2003 |

* cited by examiner

Primary Examiner—Marcos D. Pizarro
(74) Attorney, Agent, or Firm—Armstrong, Kratz, Quintos, Hanson & Brooks, LLP

(57) ABSTRACT

An active groove filled region 23a is kept at a portion of an active groove 22a connecting to an embedded region 24 positioned below a gate groove 83. The active groove filled region 23a connects to a source electrode film 58a so as to have the same electric potential as a source region 64. When a reverse bias is applied between a base region 32a and a conductive layer 12, a reverse bias is also applied between the embedded region 24 and the conductive layer 12; and therefore, depletion layers spread out together and a withstanding voltage is increased.

12 Claims, 29 Drawing Sheets

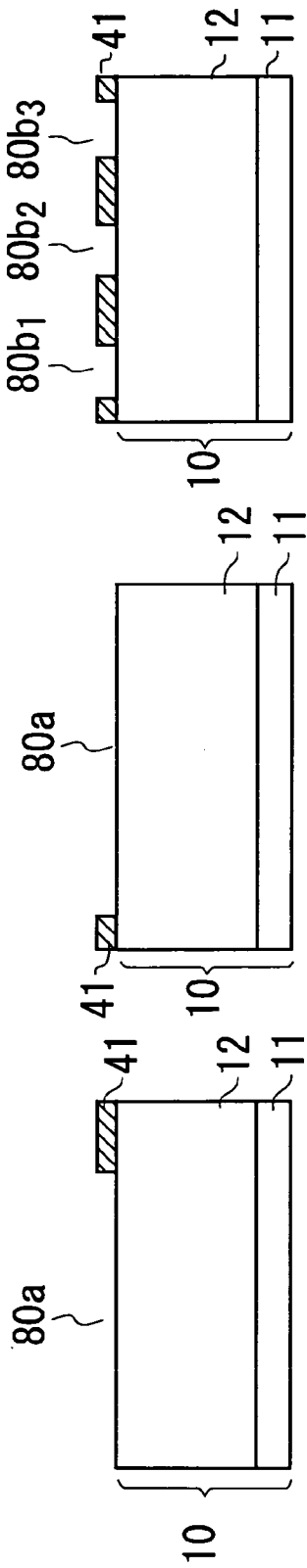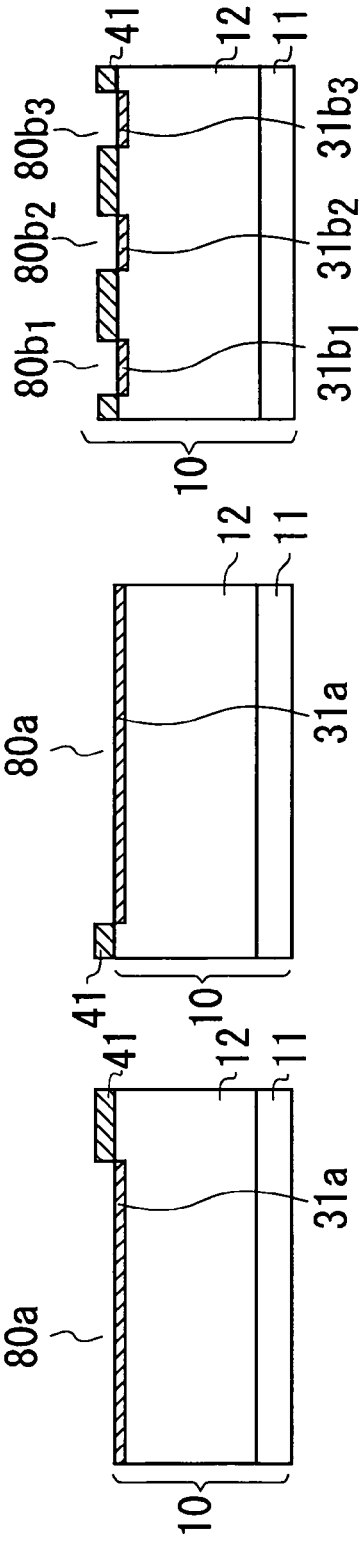

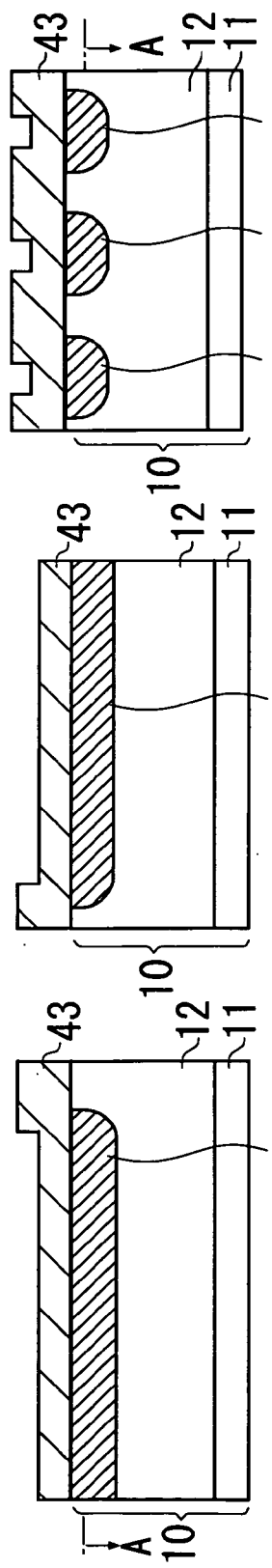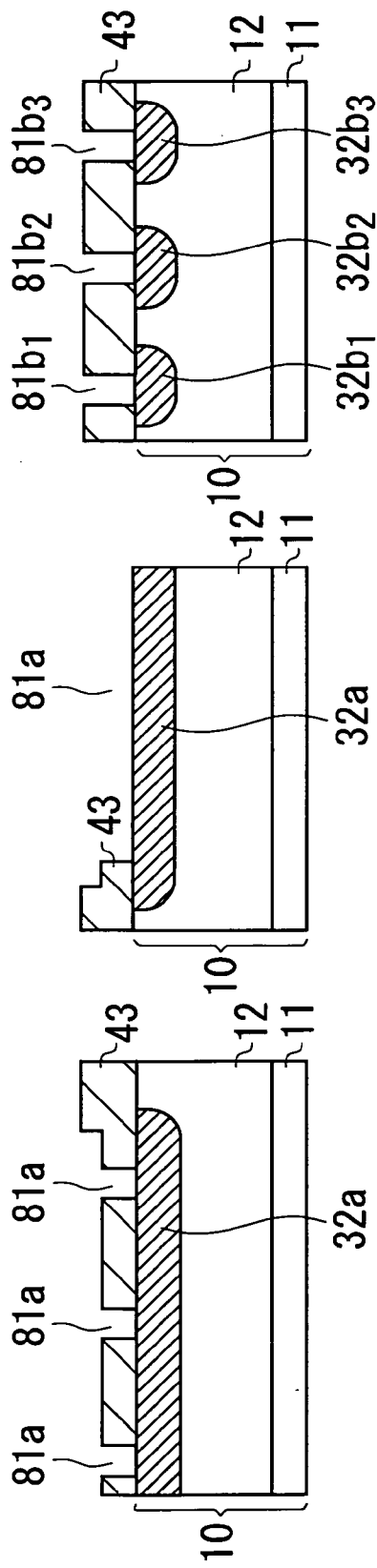

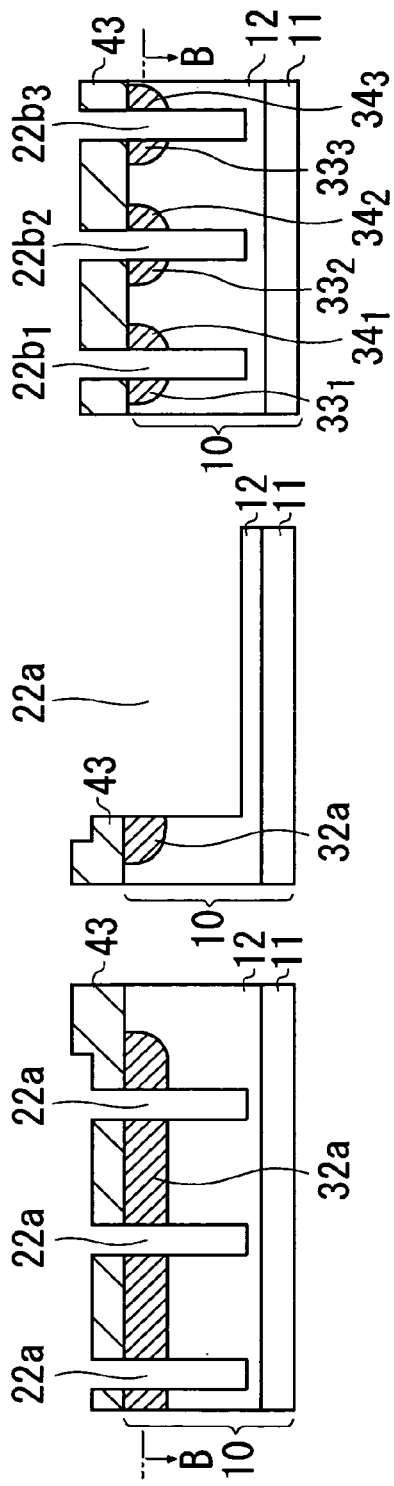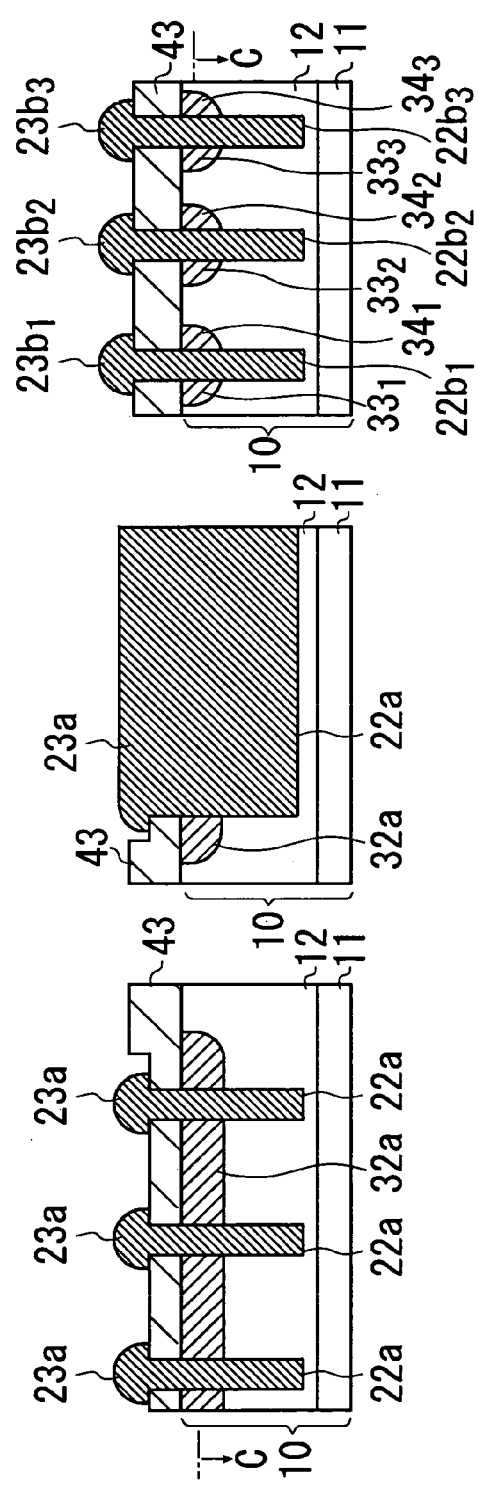

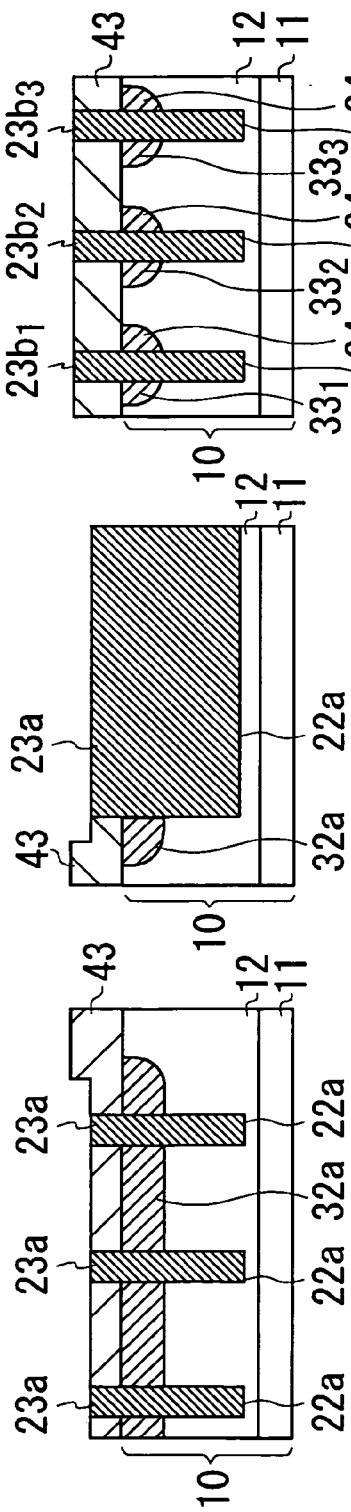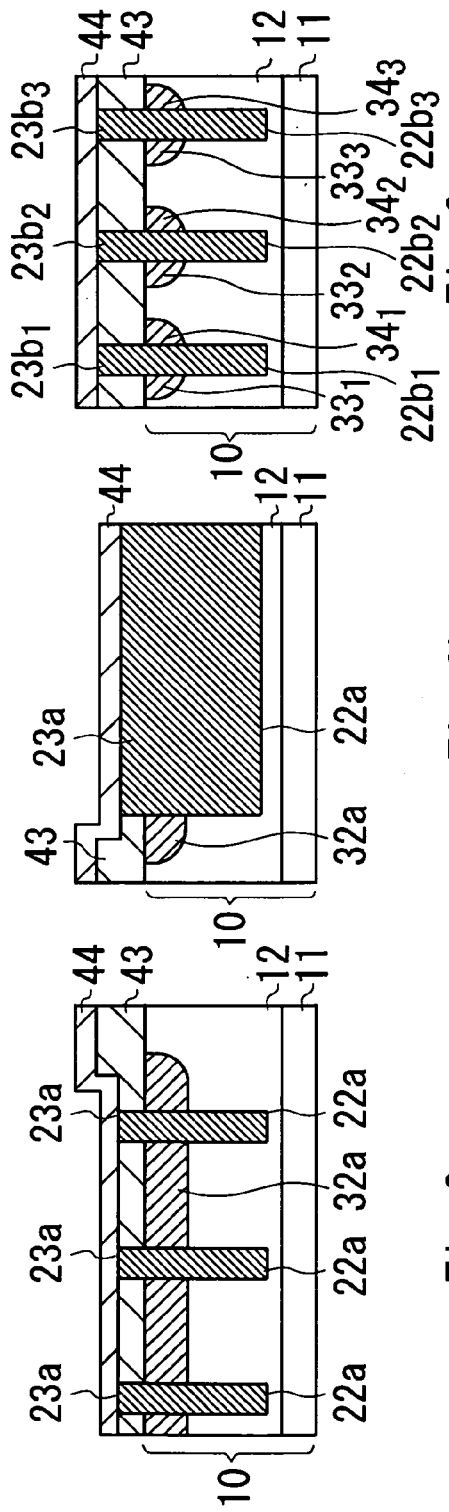

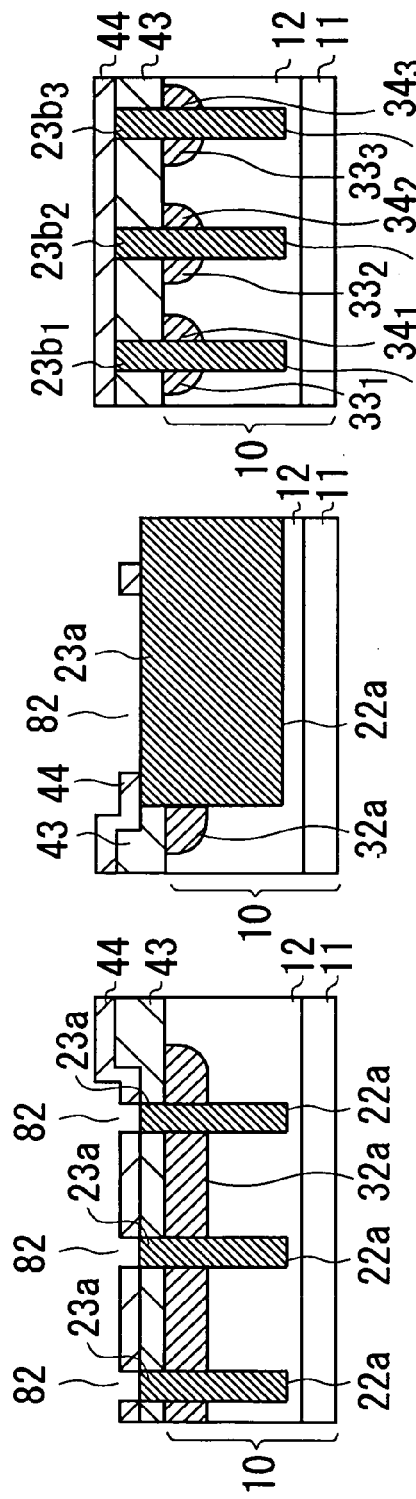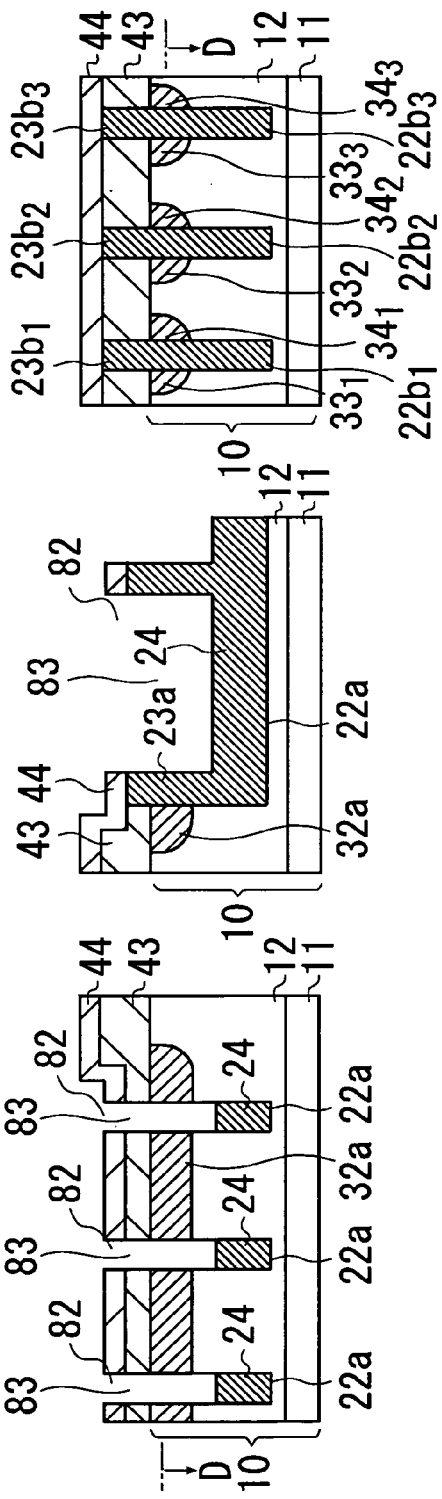

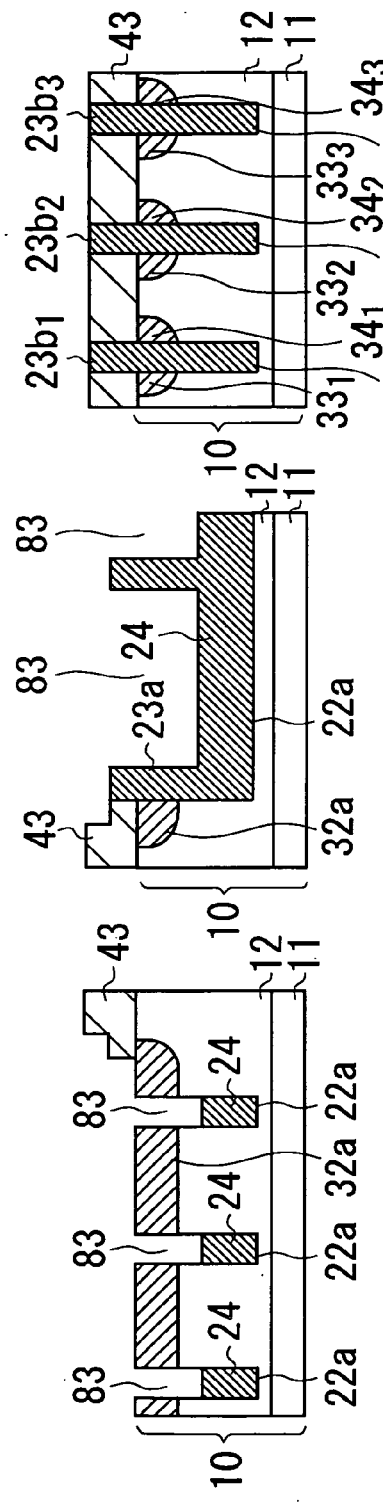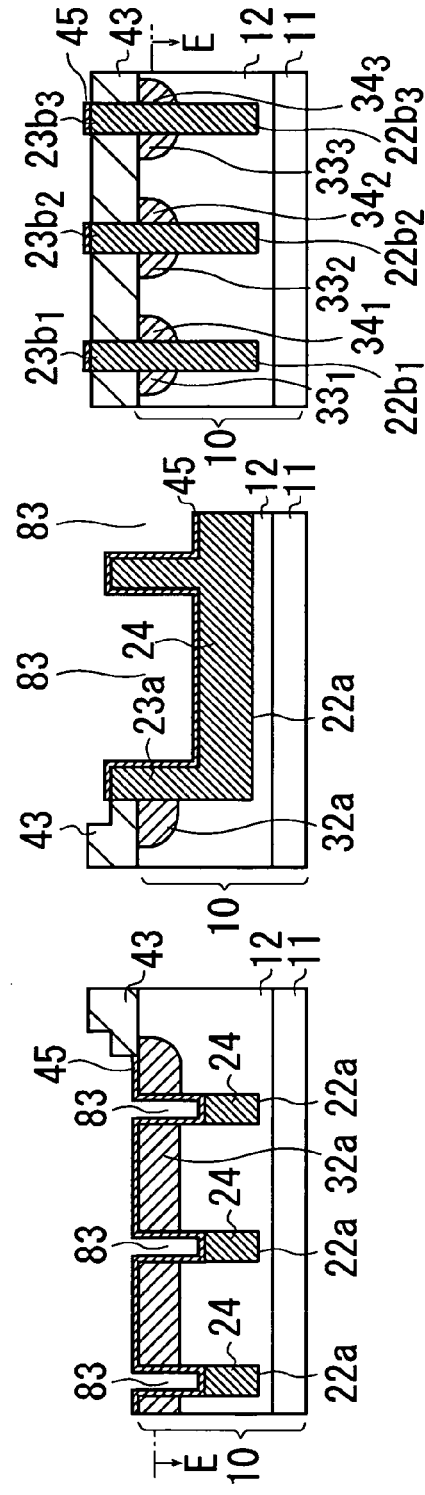

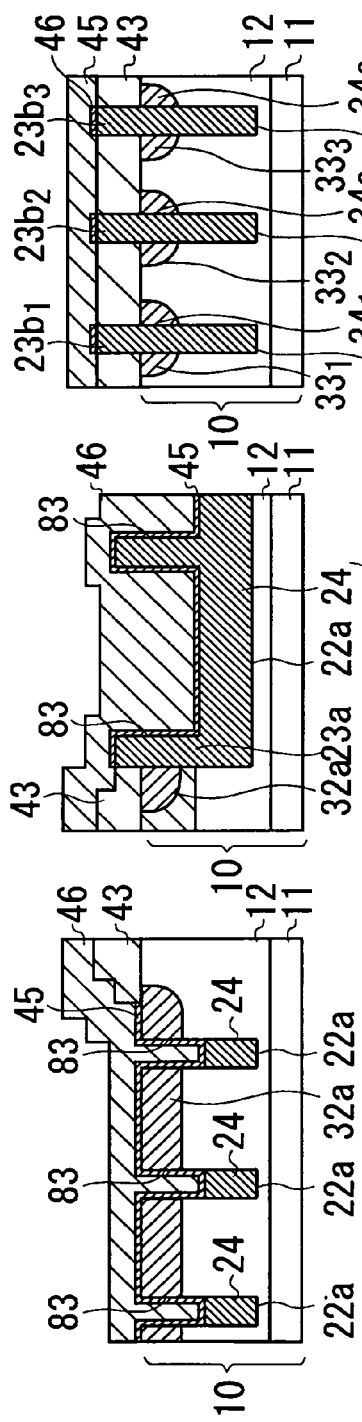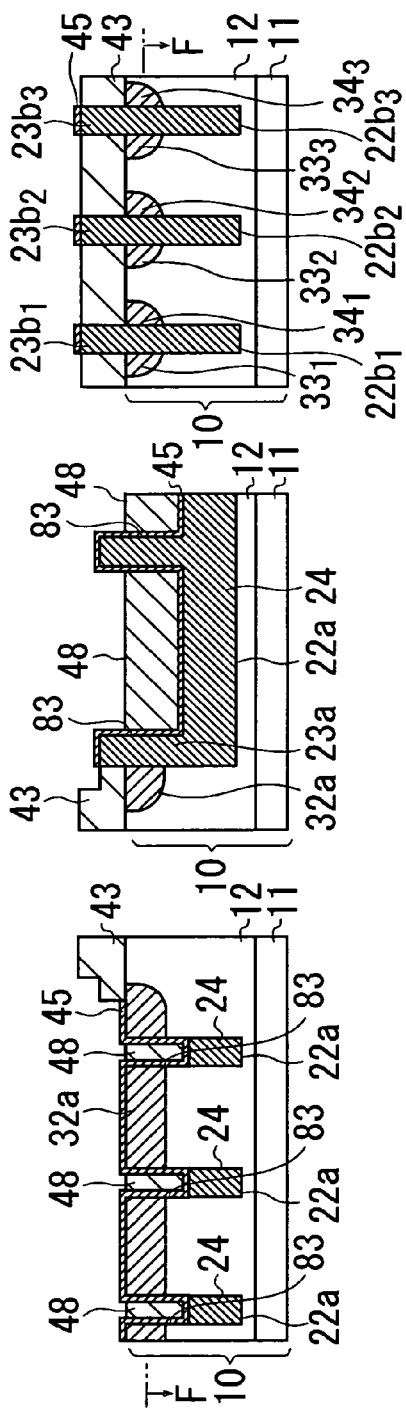

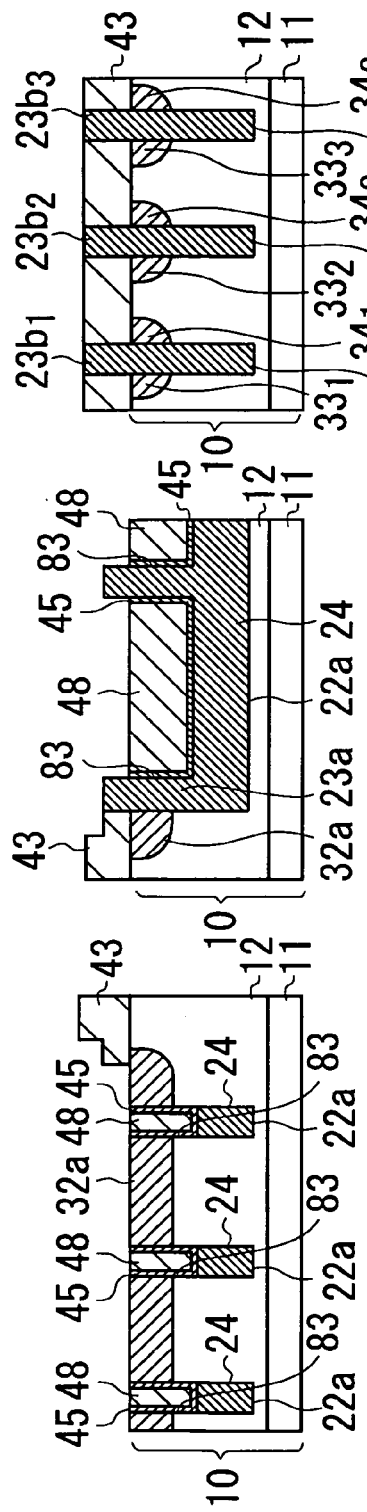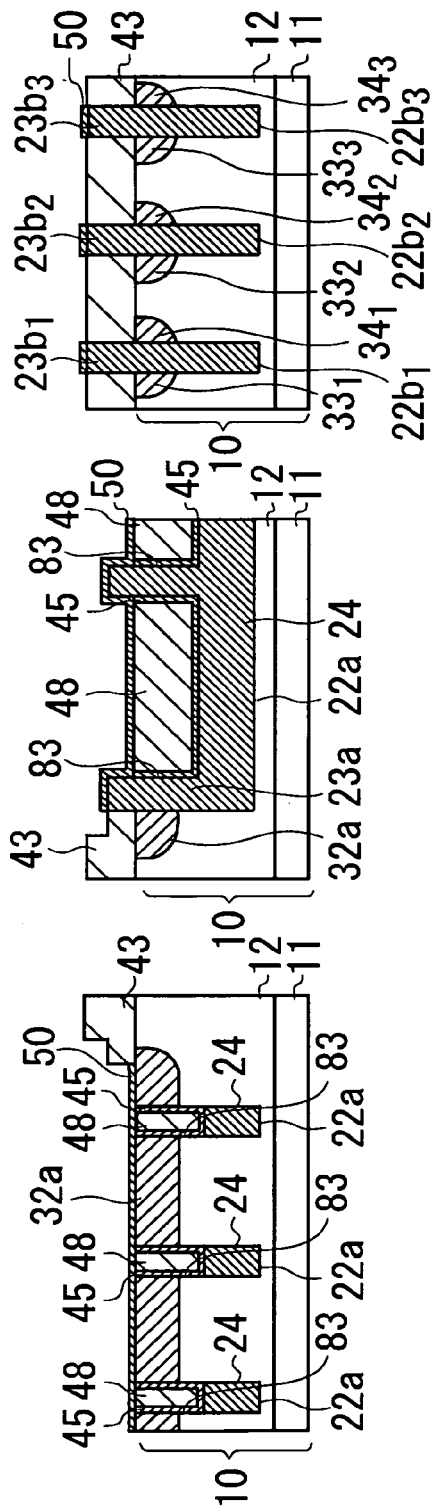

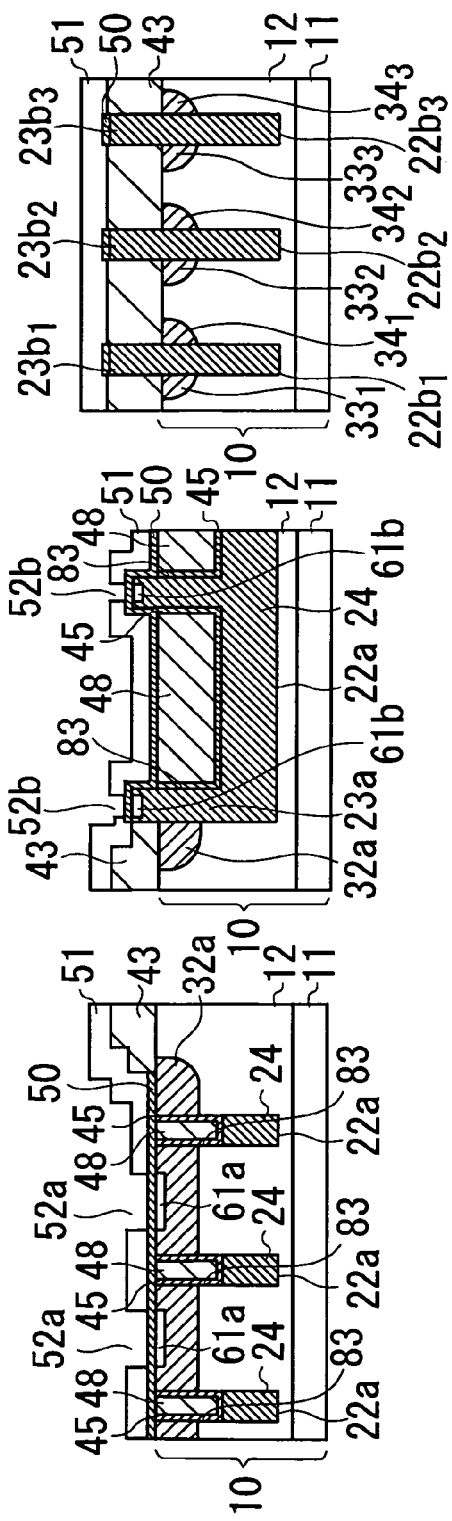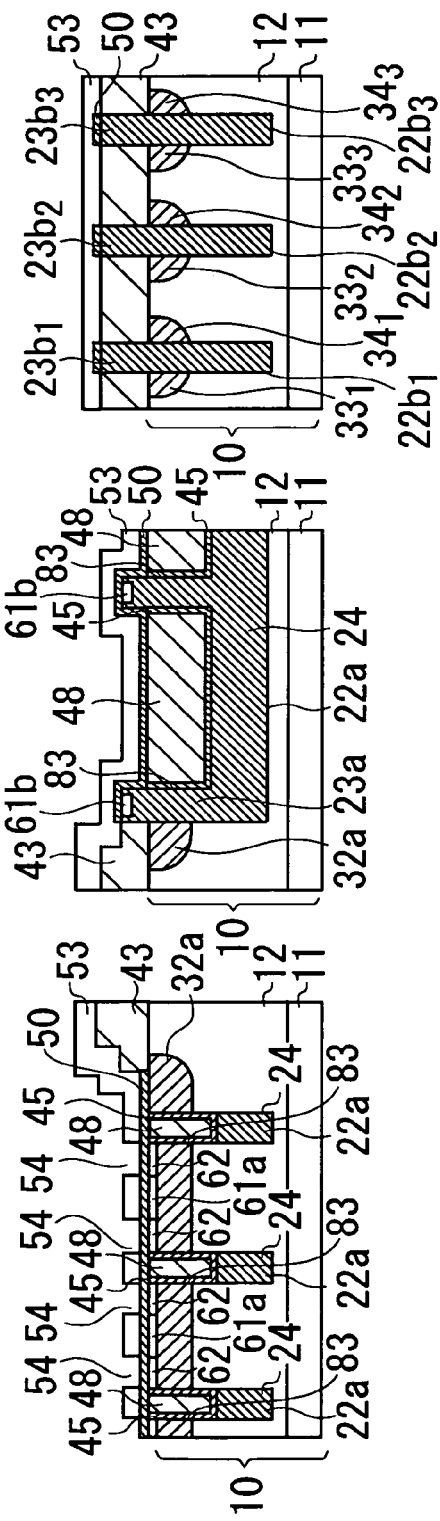

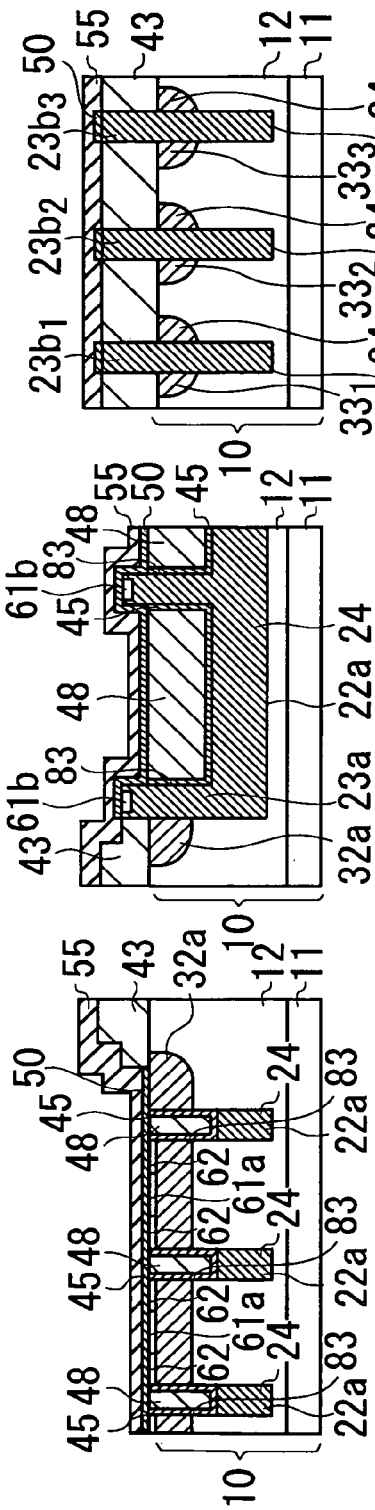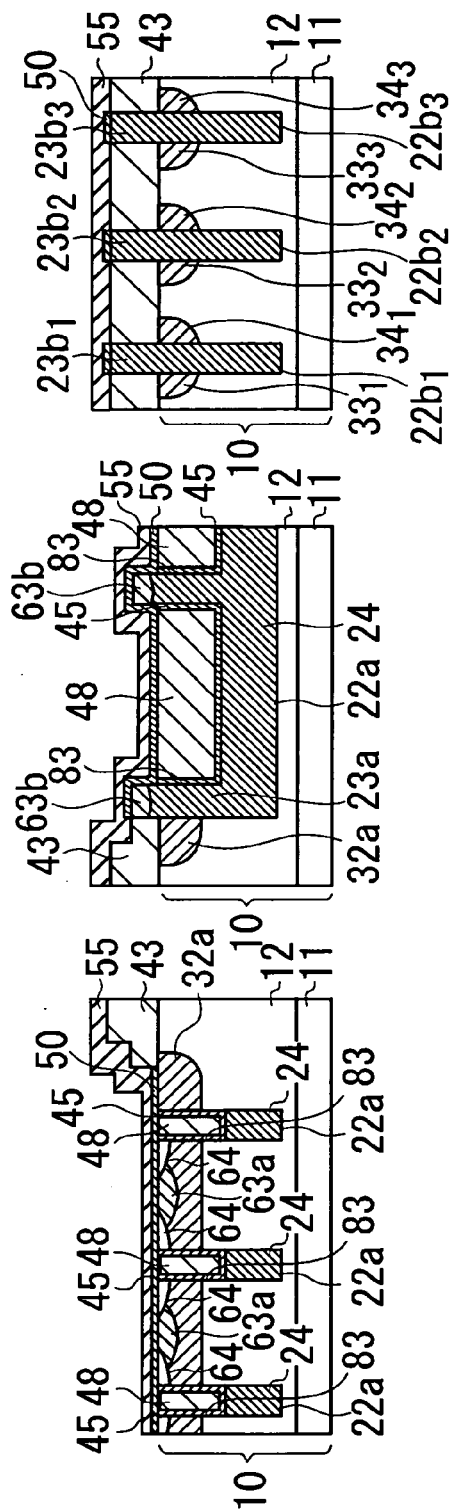

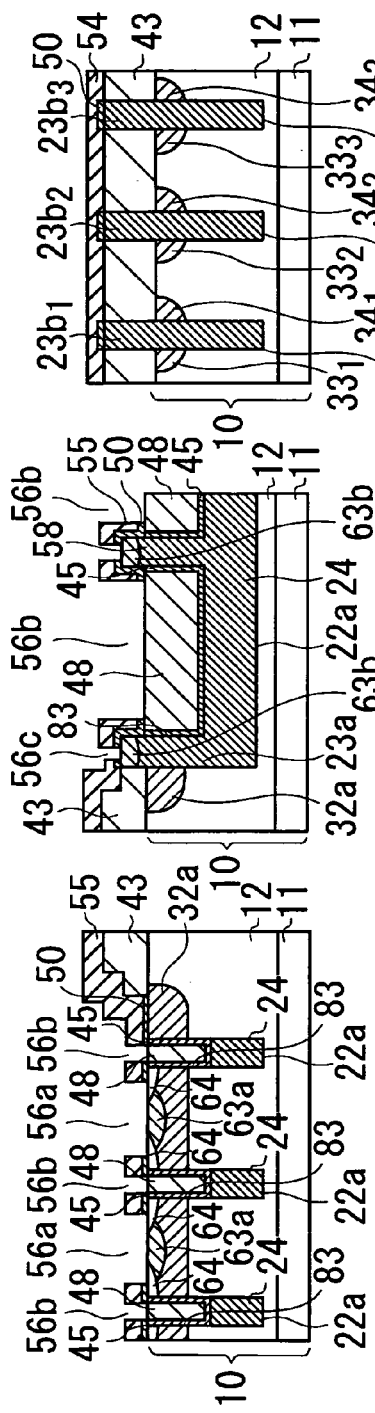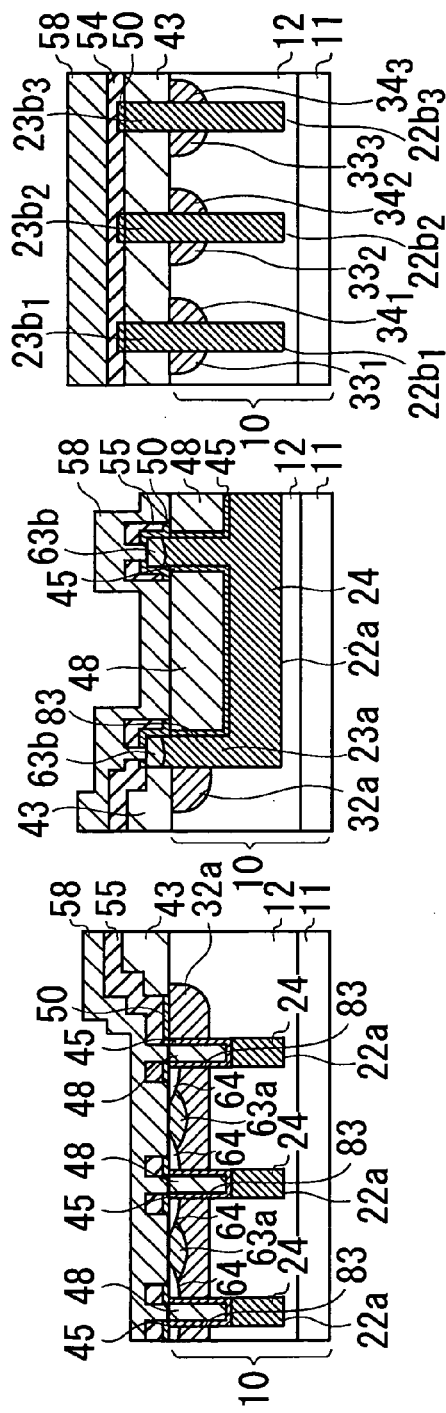

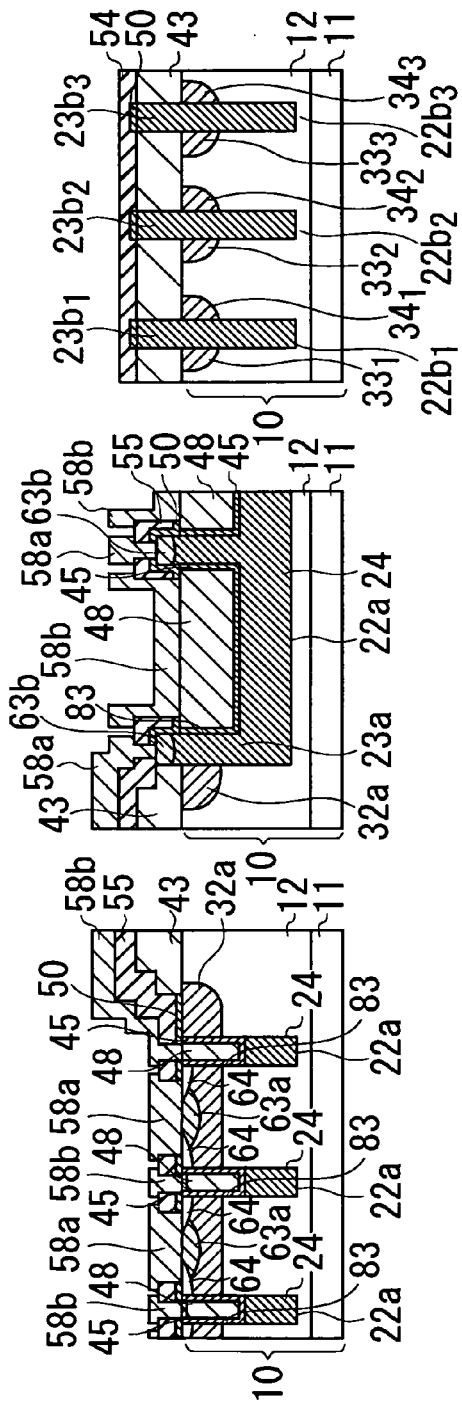
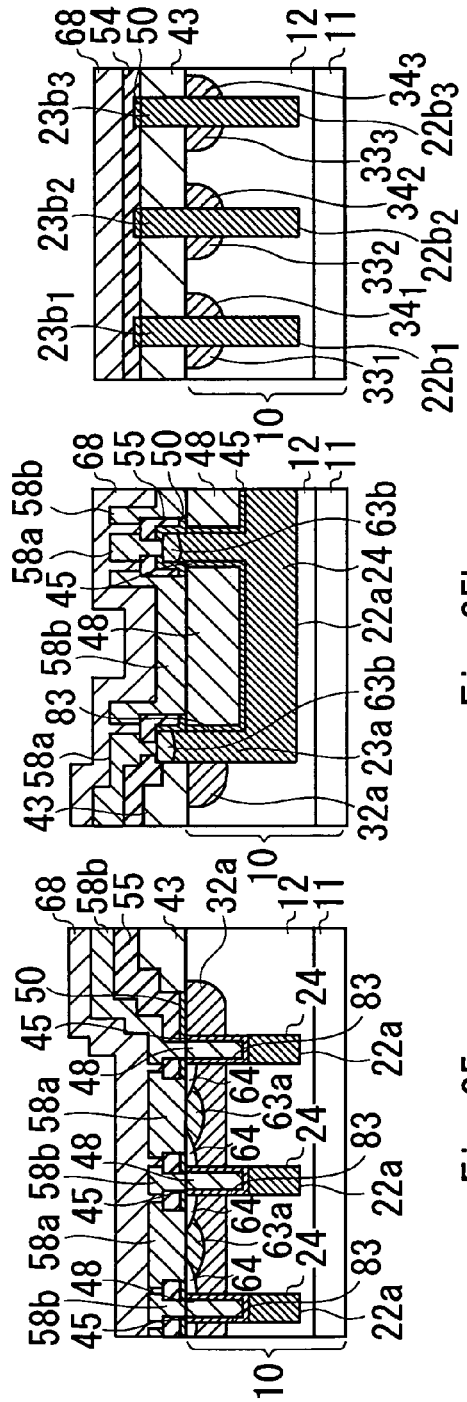

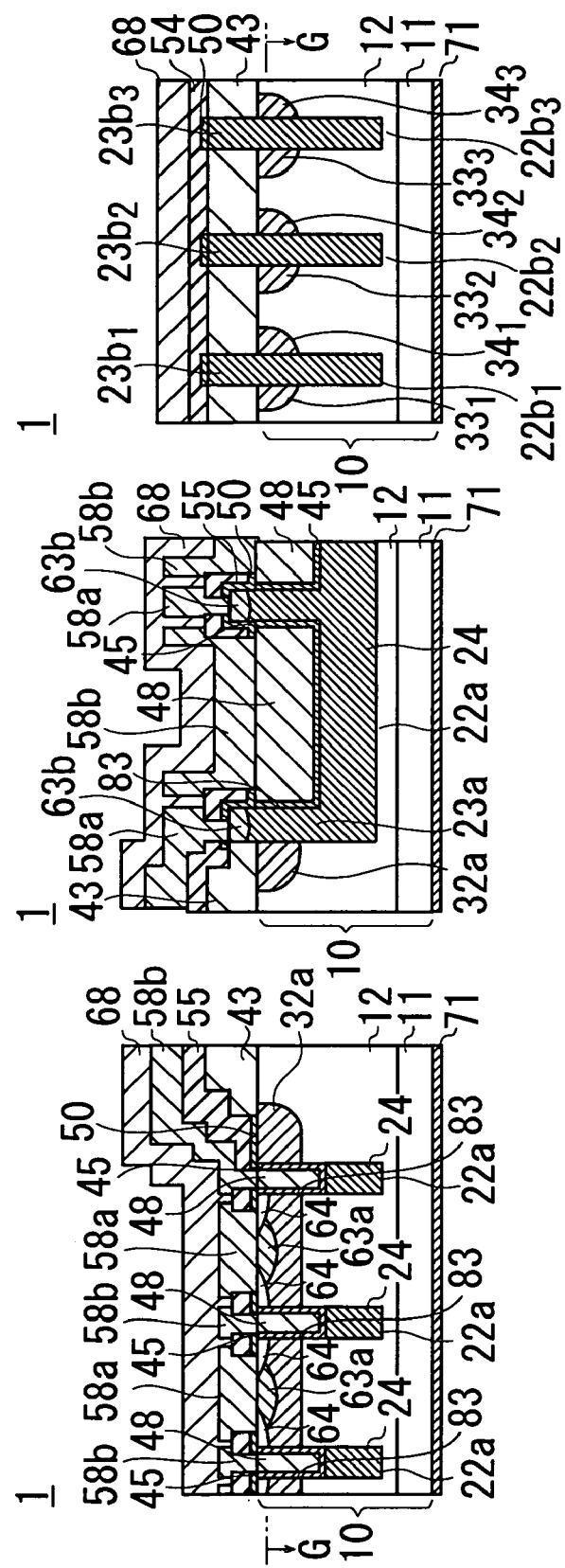

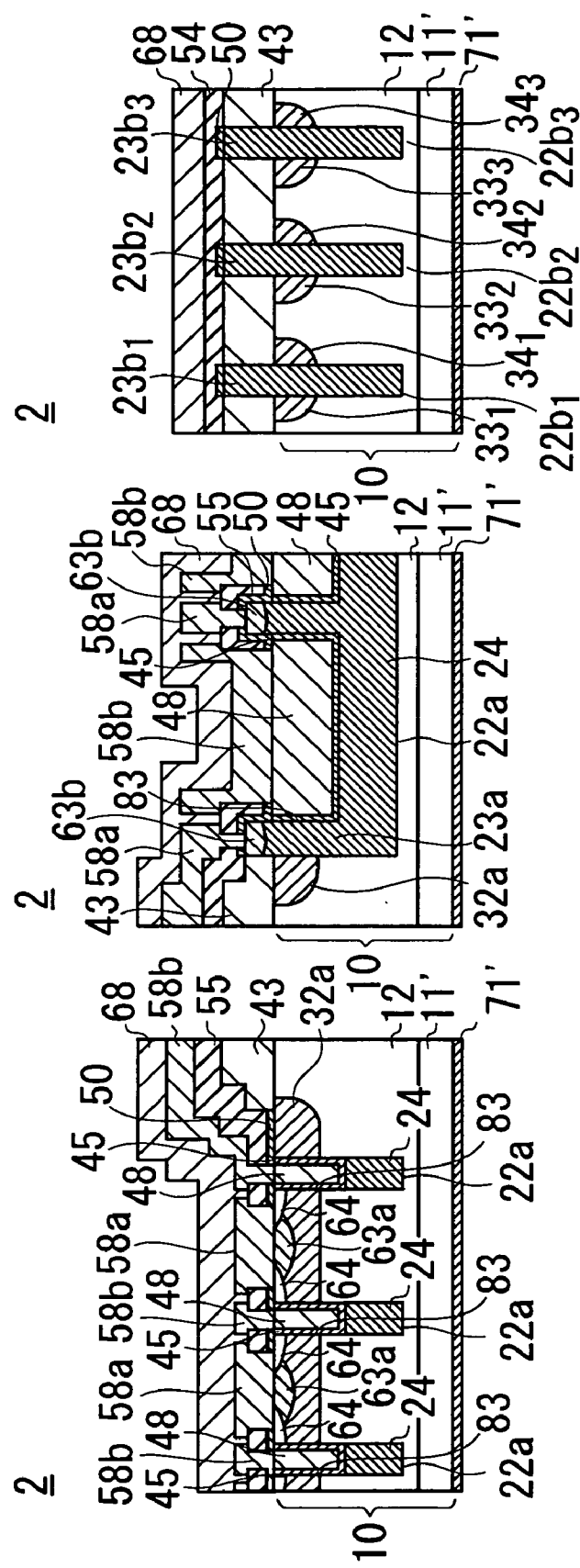

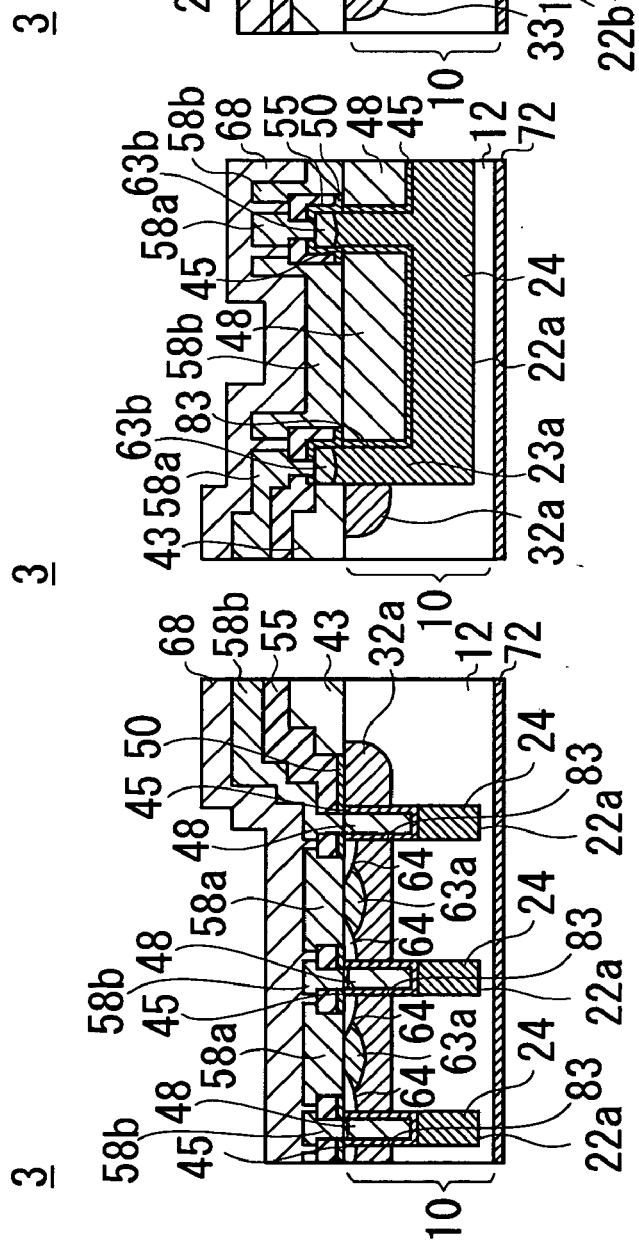

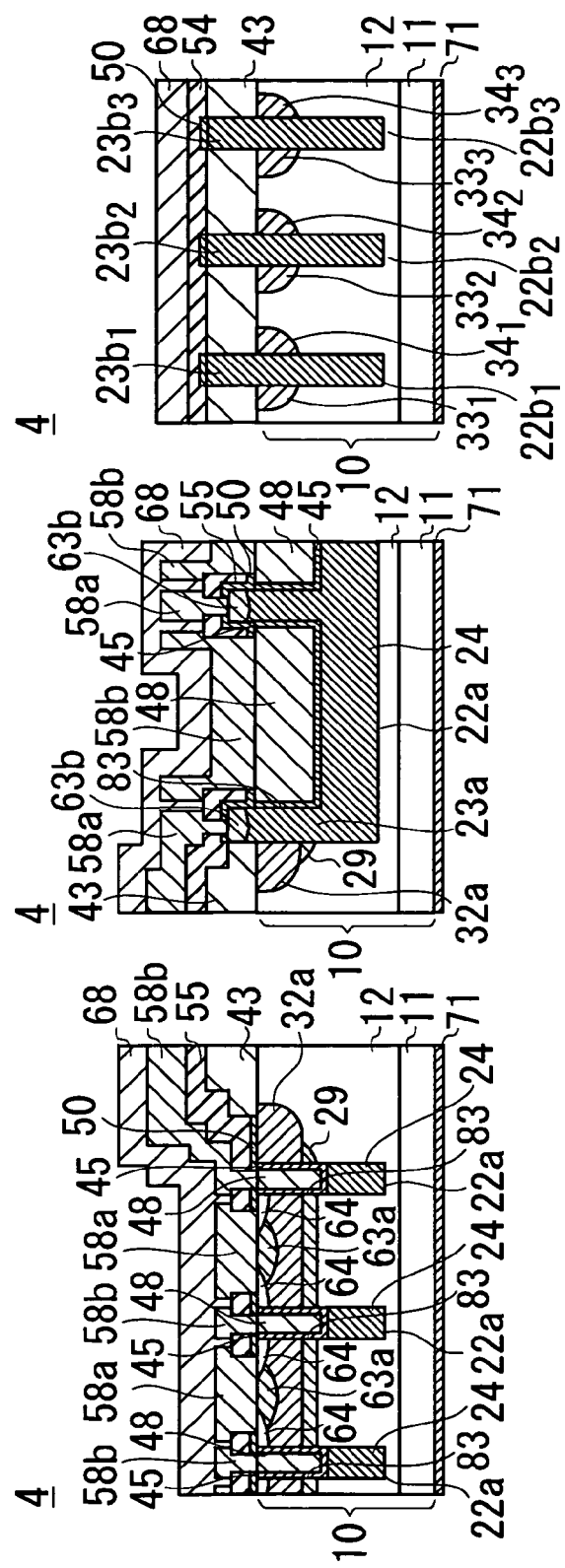

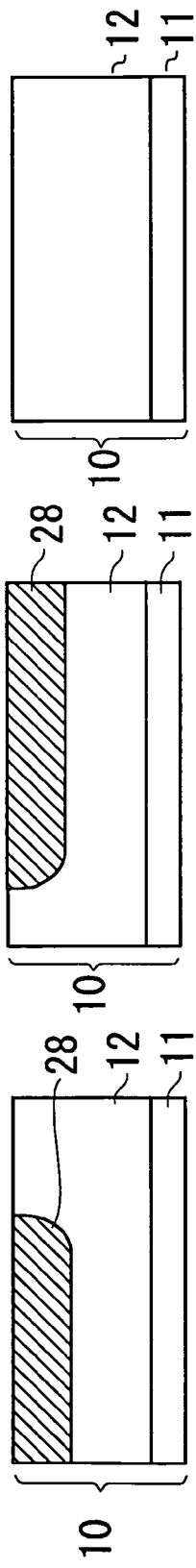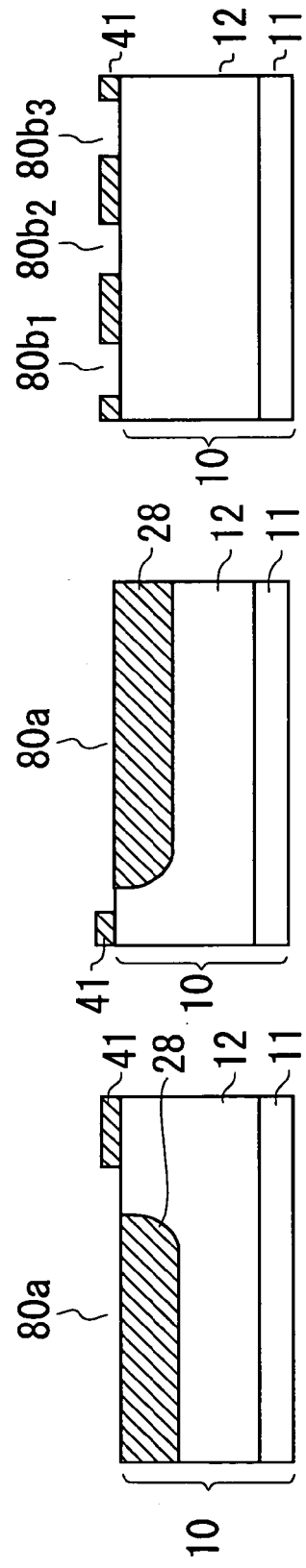

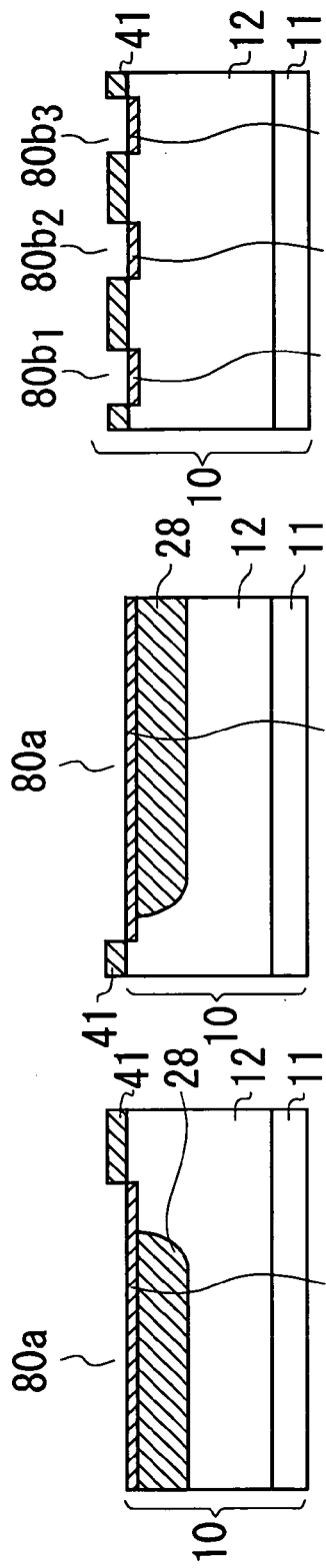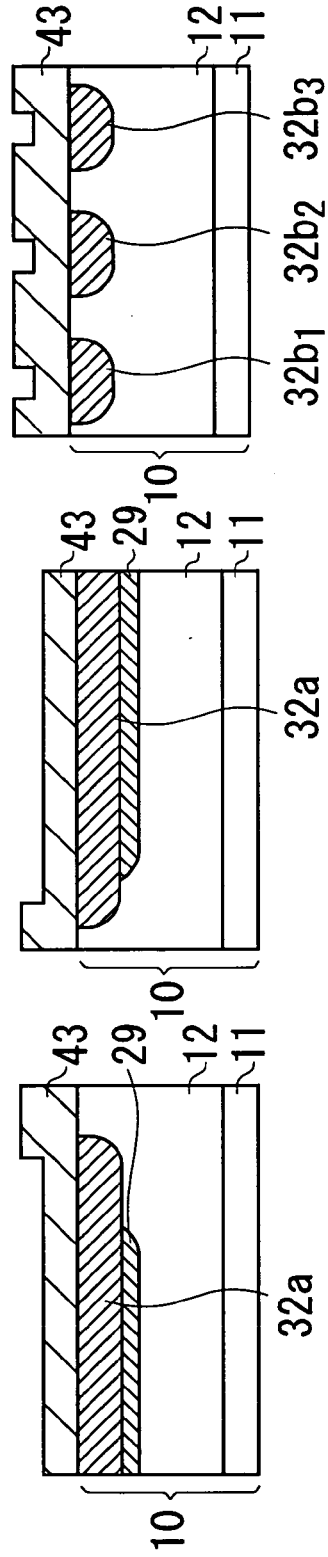

TRENCH-TYPE POWER MOSFET WITH EMBEDDED REGION AT THE BOTTOM OF THE GATE AND INCREASED BREAKDOWN VOLTAGE

This application is a continuation of international application PCT/JP03/12573 filed Oct. 1, 2003.

BACKGROUND OF THE INVENTION

1. Field of the Invention

The present invention generally relates to a semiconductor device, and more particularly to a semiconductor device in which a semiconductor filler is placed in a groove.

2. Description of the Related Art

FIG. 43 shows a cross sectional view of a transistor 102 of a previous art.

The transistor 102 is a trench-type power MOSFET and is provided with a semiconductor substrate 111 in which a silicon single crystal is doped with an N⁺-type impurity at a high concentration, and a drain layer 112 made of an N⁻-type silicon epitaxial layer formed on the semiconductor substrate 111 with an epitaxial growth technique.

The reference numeral 110 indicates a processed substrate having the semiconductor substrate 111 and the drain layer 112, and as a result of carrying out semiconductor manufacturing processes on the processed substrate 110, a p-type body layer 113 is formed on a surface side inside the drain layer 112, and pluralities of p+ type ohmic regions 116 and n+ type source regions 130 are formed at a surface vicinity inside the body layer 113.

The surface of the semiconductor substrate 110 is etched to a belt-shape at positions between the source regions 130, thus forming narrow grooves 120.

Gate insulating film 124 is formed on an inner side surface of the narrow grooves 120 and the narrow grooves 120 are filled with polysilicon in a non-contact state with the semiconductor substrate 110 due to the gate insulating film so that gate electrode plugs 127 are formed by the polysilicon.

The gate electrode plugs 127 inside the narrow grooves 120 are connected to each other by a gate electrode film made of a metal thin film not shown in the drawing.

A source electrode film 137 made of a metal thin film is formed on the surface of the source regions 130 and the ohmic regions 116. Interlayer insulating films 131 are formed on the narrow grooves 120, and the source electrode film 137 and the gate electrode plugs 127 are electrically insulated by the interlayer insulating films 131.

A drain electrode film 139 is formed on the back surface of the processed substrate 110; that is, on the surface of the semiconductor substrate 111.

The source electrode film 137 is connected to the ground potential; and when a positive voltage equal to or higher than a threshold voltage is applied to the gate electrode film while a positive voltage is applied to the drain electrode film 139, an n-type inversion layer is formed at the interface between the gate insulating film 124 and the body layer 113, and the source regions 130 and the drain layer 112 are connected by the inversion layer, with electric current flowing from the drain layer 112 to the source regions 130 via the inversion layer. This state is a state in which the transistor 102 is conductive, and since there is no JFET region, which are present in power MOSFET that do not use the narrow grooves 120, the conduction resistance is small compared to ordinary power MOSFET.

Further, when the electric potential of the gate electrode film changes from the conductive state to the same electric potential as the source electrode film 137, the inversion layer disappears so that electric current does not flow.

In this state, the pn junction between the body layer 113 and the drain layer 112 is under a reverse bias, and the avalanche breakdown voltage of the pn junction is equivalent to the withstanding voltage of the transistor 102.

Generally, the avalanche breakdown voltage of a pn junction varies depending on the state of the depletion layer under a reverse bias, but with the above-described transistor 102, since the electric field intensity within the depletion layer, which expands within the drain layer 112, is not uniform, the avalanche breakdown voltage is determined by the areas in which there is a strong electric field intensity so that the withstanding voltage is reduced.

Then, a semiconductor device 103 of a structure such as that shown in FIG. 44 has been proposed in which conductive-type embedded regions 122 different from the drain layer 112 are formed underneath the narrow grooves 120, which is an attempt to ease the electric field intensity of the depletion layer that expands in the drain layer 112.

The embedded regions 122 are formed by once cutting deeply the narrow grooves 120 and then growing a filler at the bottom portion and walls inside the narrow grooves 120, wherein a semiconductor single crystal and a semiconductor polycrystal are capable of being used as the filler.

Japanese Laid-Open Patent Publication No. 2003-69017 is a related art document of the present invention.

However, in this related art, when the embedded regions 122 are at a floating potential, the withstanding voltage is not stable. Obtaining the withstanding voltage by simulation, it was found out that the withstanding voltage is increased if the embedded regions 122 are short circuited to the source electrode film 137, and therefore a specific structure for that purpose has been required.

The present invention is devised to solve the above-described deficiencies of previous arts and it is an object thereof to provide a semiconductor device of high withstanding voltage.

SUMMARY OF THE INVENTION

In order to solve the above-described problem, a semiconductor device according to the present invention includes: a processed substrate having a conductive layer of a first conductivity type; a base region of a second conductivity type formed at an inner surface of the conductive layer; a gate groove formed in a position in which the base region of the conductive layer is provided, and the gate groove whose bottom position is formed deeper than a bottom surface of the base region; a gate insulating film provided at a side surface of the gate groove; a gate electrode plug provided inside the gate groove and being in contact with the gate insulating film; a source region of the first conductivity type provided in a position in contact with the gate insulating film within the base region, the source region being separated from the conductive layer by the base region; an embedded region of the second conductivity type provided in a position below the gate groove and being insulated from the gate electrode plug; a source electrode film in contact with the source region; and an active groove filled region of the second conductivity type in contact with the embedded region and electrically shorted with the source electrode film. In this invention, the gate groove is narrowly formed, and the active groove filled region is provided at both ends in a longitudinal direction thereof.

The semiconductor device according to the present invention, a surface of the active groove filled region is in contact with the source electrode film.

In the semiconductor device according to the present invention, an impurity layer of the second conductivity type is formed by diffusion at a portion in contact with the source electrode film at an inner surface of the active groove filled region.

In the semiconductor device according to the present invention, the source electrode film is in contact with the base region and the active groove filled region is in contact with the base region.

In the semiconductor device according to the present invention includes an active groove formed in the processed substrate, wherein the embedded region is provided on a bottom surface of the active groove, the gate groove is structured by a portion higher than the embedded region of the active groove, the active groove filled region is provided on a bottom surface of the active groove, and an upper portion of the active groove filled region is formed higher than a surface of the base region.

The semiconductor device according to the present invention includes a field insulating film provided on the conductive layer, wherein an upper portion of the active groove is positioned inside the filed insulating film, and an upper portion of the active groove filled region is positioned inside the active groove inside the field insulating film.

The semiconductor device according to the present invention includes a plurality of ring-shaped guard grooves that concentrically surround the gate groove and are separated by a predetermined spacing, and a guard groove filled region of the second conductivity type provided inside the guard groove.

The semiconductor device according to the present invention includes a plurality of ring-shaped guard grooves that concentrically surround the gate groove and are separated by a predetermined spacing, and a guard groove filled region of a second conductivity type provided inside the guard groove, wherein an upper portion of the guard groove is positioned inside the field insulating film, and an upper portion of the guard groove filled region is positioned inside the guard groove inside the filed insulating film.

In the semiconductor device according to the present invention includes a processed substrate having a conductive layer of a first conductivity type; a field insulating film provided on the conductive layer; a base region of a second conductivity type formed at an inner surface of the conductive layer; an active groove formed in a position in which the base region of the conductive layer is provided, and the active groove whose bottom portion is formed deeper than a bottom surface of the base region and whose upper portion is positioned inside the field insulating film; an embedded region of the second conductivity type provided on a bottom surface of the active groove and whose upper end portion is lower than the base region; a gate groove structured by a portion higher than the embedded region of the active groove; a gate insulating film provided at a side surface of the gate groove; a gate electrode plug provided inside the gate groove and being in contact with the gate insulating film; a source region of the first conductivity type provided in a position in contact with the gate insulating film within the base region, the source region being separated from the conductive layer by the base region; a source electrode film in contact with the source region; an active groove filled region of the second conductivity type in contact with the embedded region, whose upper end is higher than a surface of the conductive layer, and being electrically shorted with the source electrode film; a plurality of ring-shaped guard grooves that concentrically surround the active groove and are separated by a predetermined spacing and whose upper portions are respectively positioned inside the field insulating film; and a guard groove filled region of the second conductivity type provided inside the guard groove and whose upper end is higher than a surface of the conductive layer.

In the semiconductor device according to the present invention, a drain electrode film that is connected to the conductive layer is provided at a back surface of the processed substrate.

In the semiconductor device according to the present invention, a collector layer of the second conductivity type in contact with the conductive layer and a collector electrode film electrically connected to the collector layer are provided on a back surface of the processed substrate.

In the semiconductor device according to the present invention, a Schottky electrode film that forms a Schottky junction with the conductive layer is provided on a back surface of the processed substrate.

In a method for manufacturing a semiconductor device according to the present invention, the semiconductor device includes: a processed substrate having a conductive layer of a first conductivity type; a base region of a second conductivity type formed at an inner surface of the conductive layer; a gate groove formed in a position in which the base region of the conductive layer is provided, and the gate groove whose bottom position is formed deeper than a bottom surface of the base region; a gate insulating film provided at a side surface of the gate groove; a gate electrode plug provided inside the gate groove and being in contact with the gate insulating film; a source region of the first conductivity type provided in a position in contact with the gate insulating film within the base region, the source region being separated from the conductive layer by the base region; an embedded region of the second conductivity type provided in a position below the gate groove and being insulated from the gate electrode plug; a source electrode film in contact with the source region; and an active groove filled region of the second conductivity type in contact with the embedded region and electrically shorted with the source electrode film; and wherein, after the base region is formed, an active groove is formed in which the base region is exposed at an upper portion and the conductive layer is exposed at a lower portion, and after a semiconductor filler of the second conductivity type is grown inside the active groove, an upper portion of a partial region of the semiconductor filler is removed until a position lower than a bottom surface of the base region so that the embedded region is formed by a remaining lower portion, the gate groove is structured by a portion in which the semiconductor filler has been removed, and an active groove filled region in contact with the base region is structured by a portion in which an upper portion of the semiconductor filler has not been removed.

In the method for manufacturing a semiconductor device according to the present invention, an impurity of the second conductivity type is diffused into a surface of the active groove filled region to form a diffusion region, and a source electrode film that forms an ohmic junction with the source region and with the diffusion region is formed.

BRIEF DESCRIPTION OF THE DRAWINGS

FIGS. 2a, 2b, and 2c are first views for illustrating a manufacturing step of a semiconductor device according to the present invention.

FIGS. 3a, 3b, and 3c are second views for illustrating a manufacturing step of a semiconductor device according to the present invention.

FIGS. 4a, 4b, and 4c are third views for illustrating a manufacturing step of a semiconductor device according to the present invention.

FIGS. 5a, 5b, and 5c are fourth views for illustrating a manufacturing step of a semiconductor device according to the present invention.

FIGS. 6a, 6b, and 6c are fifth views for illustrating a manufacturing step of a semiconductor device according to the present invention.

FIGS. 7a, 7b, and 7c are sixth views for illustrating a manufacturing step of a semiconductor device according to the present invention.

FIGS. 8a, 8b, and 8c are seventh views for illustrating a manufacturing step of a semiconductor device according to the present invention.

FIGS. 9a, 9b, and 9c are eighth views for illustrating a manufacturing step of a semiconductor device according to the present invention.

FIGS. 10a, 10b, and 10c are ninth views for illustrating a manufacturing step of a semiconductor device according to the present invention.

FIGS. 11a, 11b, and 11c are tenth views for illustrating a manufacturing step of a semiconductor device according to the present invention.

FIGS. 12a, 12b, and 12c are eleventh views for illustrating a manufacturing step of a semiconductor device according to the present invention.

FIGS. 13a, 13b, and 13c are twelfth views for illustrating a manufacturing step of a semiconductor device according to the present invention.

FIGS. 14a, 14b, and 14c are thirteenth views for illustrating a manufacturing step of a semiconductor device according to the present invention.

FIGS. 15a, 15b, and 15c are fourteenth views for illustrating a manufacturing step of a semiconductor device according to the present invention.

FIGS. 16a, 16b, and 16c are fifteenth views for illustrating a manufacturing step of a semiconductor device according to the present invention.

FIGS. 17a, 17b, and 17c are sixteenth views for illustrating a manufacturing step of a semiconductor device according to the present invention.

FIGS. 18a, 18b, and 18c are seventeenth views for illustrating a manufacturing step of a semiconductor device according to the present invention.

FIGS. 19a, 19b, and 19c are eighteenth views for illustrating a manufacturing step of a semiconductor device according to the present invention.

FIGS. 20a, 20b, and 20c are nineteenth views for illustrating a manufacturing step of a semiconductor device according to the present invention.

FIGS. 21a, 21b, and 21c are twentieth views for illustrating a manufacturing step of a semiconductor device according to the present invention.

FIGS. 22a, 22b, and 22c are twenty-first views for illustrating a manufacturing step of a semiconductor device according to the present invention.

FIGS. 23a, 23b, and 23c are twenty-second views for illustrating a manufacturing step of a semiconductor device according to the present invention.

FIGS. 24a, 24b, and 24c are twenty-third views for illustrating a manufacturing step of a semiconductor device according to the present invention.

FIGS. 25a, 25b, and 25c are twenty-fourth views for illustrating a manufacturing step of a semiconductor device according to the present invention.

FIGS. 26a, 26b, and 26c are twenty-fifth views for illustrating a manufacturing step of a semiconductor device according to the present invention.

FIGS. 27a, 27b, and 27c are sectional views for illustrating a structure when the present invention is a pn junction type IGBT.

FIGS. 28a, 28b, and 28c are sectional views for illustrating a structure when the present invention is a Schottky junction type IGBT.

FIGS. 37a, 37b, and 37c are sectional views for illustrating a diffusion structure when the present invention is a semiconductor device provided with a low resistance region.

FIGS. 38a, 38b, and 38c are first sectional views for illustrating a manufacturing step thereof.

FIGS. 39a, 39b, and 39c are second sectional views for illustrating a manufacturing step thereof.

FIGS. 40a, 40b, and 40c are third sectional views for illustrating a manufacturing step thereof.

FIGS. 41a, 41b, and 41c are fourth sectional views for illustrating a manufacturing step thereof.

BRIEF DESCRIPTION OF REFERENCE NUMERAL

Figure 1:
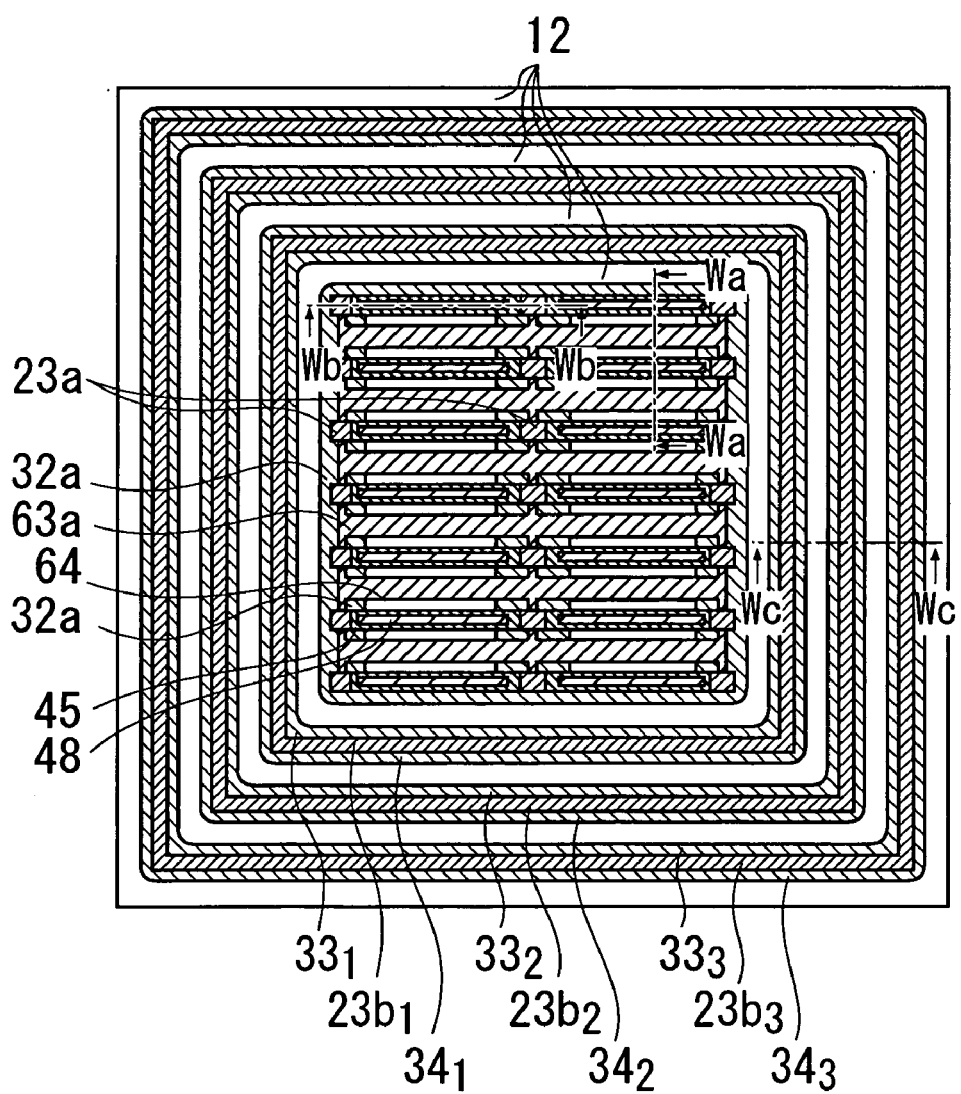
FIG. 1 is a plan view showing a diffusion structure of an example of a semiconductor device according to the present invention and is a sectional view taken along the line G—G in FIG. 26.

In each of the drawings, reference numerals 1 to 5 respectively indicate a semiconductor device. Reference numeral 10 indicates a processed substrate. Reference numeral 11 indicates a single crystal substrate. Reference numeral 11' indicates a collector layer. Reference numeral 12 indicates a conductive layer. Reference numeral 22a indicates an active groove. Reference numerals $22b_1$ to $22b_3$ indicate a guard groove. Reference numeral 23a indicates an active groove filled region. Reference numerals $23b_1$ to $23b_3$ indicate a guard groove filled region. Reference numeral 24 indicates an embedded region. Reference numeral 32a indicates a base region. Reference numeral 43 indicates a field insulating film. Reference numeral 45 indicates a gate insulating film. Reference numeral 48 indicates a gate electrode plug. Reference numeral 58a indicates a source electrode film. Reference numeral 58b indicates a gate electrode film. Reference numeral 64 indicates a source region. Reference numeral 71 indicates a drain electrode film. Reference numeral 71' indicates a collector electrode film. Reference numeral 72 indicates a Schottky electrode film. Reference numeral 83 indicates a gate groove.

DETAILED DESCRIPTION OF THE PREFERRED EMBODIMENTS

The present invention is structured as described above with a processed substrate in which source regions, base regions, and a conductive layer are provided from above, in that order, in a position connecting to a gate insulating film formed on a side surface of the gate grooves.

The gate electrode plugs are in contact with the source regions, the base regions and the conductive layer via the gate insulating film, and when a voltage equal to or higher than a threshold voltage is applied to the gate electrode plugs, an inversion layer of the first conductivity type is formed at a portion in contact with the gate insulating film within the base regions, and the source regions and the conductive layer are electrically connected by the inversion layer so that the semiconductor device becomes conductive.

Then, in the present invention, embedded regions of a second conductivity type are provided at positions below the gate grooves, and the embedded regions are in contact with active groove filled regions of the second conductivity type.

The active groove filled regions are electrically connected to a source electrode film, and the source electrode film is in contact with the source regions. As a result, the embedded regions are electrically connected to the source regions via the active groove filled regions.

Accordingly, the source regions and the embedded regions become electrically the same electric potential; and when the source regions and the base regions are shorted and a reverse bias voltage of pn junction which is formed between the conductive layer and the base regions is applied between the conductive layer and the source regions, the pn junction formed between the embedded regions and the conductive layer is also reversely biased. Therefore, depletion layers spread out within the conductive layer from both the base regions and the embedded regions.

When a voltage is applied that allows areas of the conductive layer that are positioned between the bottom surface of the base regions and the bottom portion of the embedded regions to be filled with depletion layers, by adjusting the concentration of impurities in the conductive layer and the embedded regions and adjusting the height of the embedded regions, the insides of the embedded regions are filled with depletion layers so that the electric field intensity in regions positioned below the bottom surface of the base region can be reduced; thereby, increasing the withstanding voltage.

EXAMPLES

The following are descriptions of examples of the present invention.

In the present and following examples, one of the p-type and n-type is a first conductivity type and the other is a second conductivity type. Accordingly, if the first conductivity type is the n-type, then the second conductivity type is the p-type; and conversely, if the first conductivity type is the p-type, then the second conductivity type is the n-type, and the present invention is includes both of these.

<Structural Description>

Reference numeral 1 in FIG. 1 indicates a first example of a semiconductor device according to the present invention. FIG. 1 is a plan view for illustrating a diffusion structure of the semiconductor device 1.

Positioned in an active region, which is the central area of the semiconductor device 1, are a base region 32a and a source region 64, which are to be described below, and positioned in a withstanding voltage region, which is a region at the periphery of the active region, surrounding the active region are guard groove filled regions $23b_1$ to $23b_3$ and inner circumferential and outer circumferential assistive diffusion regions $33_1$ to $33_3$ and $34_1$ to $34_3$, which are to be described below.

Sectional views of the active region along line Wa—Wa and line Wb—Wb in FIG. 1 are shown in FIGS. 26a and 26b. Furthermore, a sectional view of the withstanding voltage region along line Wc—Wc in FIG. 1 is shown in FIG. 26c. FIG. 1 is a sectional view taken along the line G—G in FIGS. 26a to 26c.

With reference to FIG. 1 and FIGS. 26a to 26c, the semiconductor device 1 is provided with a single crystal substrate 11 and a conductive layer 12 that is in contact with the single crystal substrate 11.

The single crystal substrate 11 is constituted by a silicon single crystal of a first conductivity type and the conductive layer 12 is constituted by a silicon epitaxial layer of the first conductivity type that has been grown by an epitaxial technique on the surface of the single crystal substrate 11. The conductive layer 12 has a low level of concentration compared to the concentration of the single crystal substrate 11, and is made as its depletion layer can spread easily.

A base region 32a of the second conductivity type is formed with a predetermined depth at an inner surface of a portion positioned in the active region in the conductive layer 12.

Here the reference numeral 10 indicates the processed substrate that is targeted for processing and includes such elements as the conductive layer 12 and a dispersion layer such as the base region 32a.

The planar shape of the base region 32a is a quadrilateral in which the four corners are rounded, and a plurality of narrow active grooves 22a are positioned in parallel at regular intervals in a region inward from the periphery thereof. The active grooves 22a are positioned inward from the periphery of the base region 32a by a fixed distance.

Ohmic regions 63a of the same conductivity type as the base region 32a are positioned between adjacent active grooves 22a at an inner surface of the base region 32a in a central vicinity between the active grooves 22a. The surface concentration of the ohmic regions 63a is a higher concentration than the surface concentration of the base region 32a and is configured so as to form ohmic contact with a metal (such as, aluminum).

Source regions 64 of the first conductivity type are positioned between the ohmic regions 63a and the active grooves 22a; that is, at the inner surface of the base region 32a positioned on one or both sides of the active grooves 22a.

On the other hand, a plurality (here, three) ring-shaped guard grooves $22b_1$ to $22b_3$ are formed concentrically in the withstanding voltage region and the base region 32a is positioned further inward from the innermost guard groove $22b_1$. Accordingly, the base region 32a is concentrically surrounded by the guard grooves $22b_1$ to $22b_3$.

The guard grooves $22b_1$ to $22b_3$ have a depth in which their bottom surfaces are positioned inside the conductive layer 12, and the upper openings thereof are positioned in a field insulating film 43 on the surface of the conductive layer 12.

Inside the active grooves 22a, in a portion thereof from the bottom surface to the opening, a semiconductor single crystal (here a silicon single crystal) of the second conductivity type is provided to form an active groove filled region 23a, and for the other portions, a semiconductor single crystal of the second conductivity type is provided in a lower portion only, forming an embedded region 24.

Here, the active groove filled region 23a is provided at both edges and in the center of each of the active grooves 22a.

Furthermore, the semiconductor single crystal of the second conductivity type is provided also between the bottom surface and the opening of each of the guard grooves $22b_1$ to $22b_3$, with this forming guard groove filled regions $23b_1$ to $23b_3$.

The upper portions than the embedded region 24 in the active grooves 22a are called gate grooves and are given the reference numeral 83, and a gate insulating film 45 is provided on a side surface and bottom surface of the gate grooves 83. The space inside the gate grooves 83 is surrounded by the gate insulating film 45, and a gate electrode plug 48 is provided in this space. The gate electrode plugs 48 are insulated from the embedded region 24, the base region 32a, the source regions 64, the conductive layer 12, and the active groove filled region 23a.

The active groove filled region 23a and the guard groove filled regions $23b_1$ to $23b_3$ are provided up into the inside of the field insulating film 43 positioned on the processed substrate 10; and accordingly, the upper end portions of the active groove filled region 23a and the upper end portions of the guard groove filled regions $23b_1$ to $23b_3$ are positioned above from the conductive layer 12.

Inner circumferential assistive diffusion regions $33_1$ to $33_3$ of the second conductivity type are formed in contact with the entire inner length at the inner side of each of the guard groove filled regions $23b_1$ to $23b_3$ at a surface vicinity inside the conductive layer 12, and outer circumferential assistive diffusion regions $34_1$ to $34_3$ of the second conductivity type are formed in contact with the entire outer length at the outer side. Accordingly, each of the inner and outer circumferential assistive diffusion regions $33_1$ to $33_3$ and $34_1$ to $34_3$ are ring-shaped.

The inner circumferential assistive diffusion regions $33_1$ to $33_3$ are each in contact with only one of the plurality of guard groove filled regions $23b_1$ to $23b_3$; and similarly, the outer circumferential assistive diffusion regions $34_1$ to $34_3$ are each in contact with only one of the plurality of guard groove filled regions $23b_1$ to $23b_3$.

The inner circumferential assistive diffusion regions $33_1$ to $33_3$ and the outer circumferential assistive diffusion regions $34_1$ to $34_3$ are not in contact. Accordingly, the guard groove filled regions $23b_1$ to $23b_3$ are electrically separate from each other.

Since the assistive diffusion regions $33_1$ to $33_3$ and $34_1$ to $34_3$ are formed together with the base region 32a, they have the same depth and are shallower than the guard groove filled regions 23b.

Figure 35:
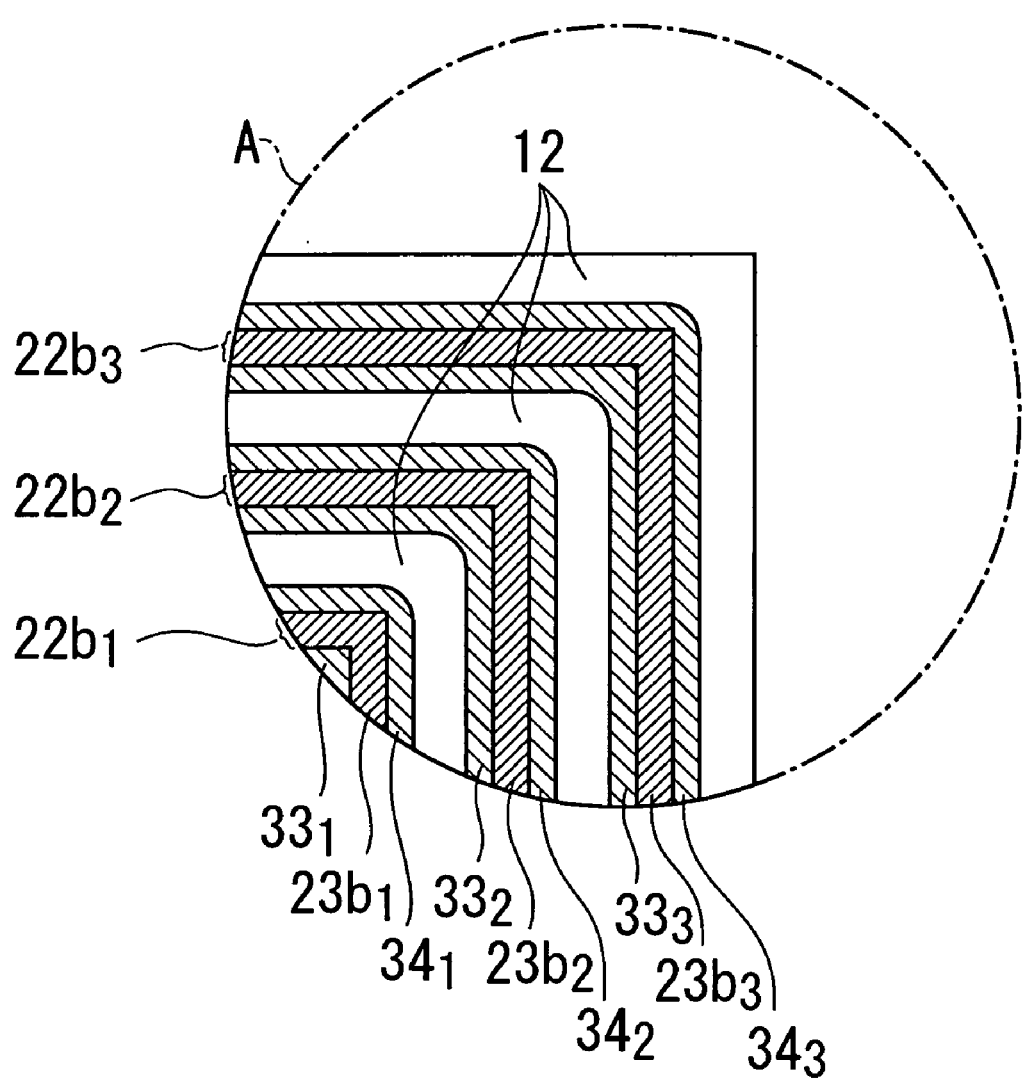
FIG. 35 is an enlarged view of a corner portion of guard grooves of a semiconductor device according to the present invention.

FIG. 35 is an enlarged view of angle portions of the plurality of guard grooves $22b_1$ to $22b_3$.

The four corner portions of the guard grooves $22b_1$ to $22b_3$ meet at right angles, but the inner and outer circumferential assistive diffusion regions $33_1$ to $33_3$ and $34_1$ to $34_3$ are positioned at the inner circumferential and outer circumferential four corner portions.

The angle portions of the outer circumferential assistive diffusion regions $34_1$ to $34_3$ are formed as quarter circles with a radius equal to or more than 0.7 μm.

Since the shape of the guard groove filled regions $23b_1$ to $23b_3$ is the same shape as the guard grooves $22b_1$ to $22b_3$, the four corner portions meet at a right angle (90 degrees), but rounded inner circumferential assistive diffusion regions $33_1$ to $33_3$ and outer circumferential assistive diffusion regions $34_1$ to $34_3$ are formed at upper portions of the four corner portions of the outer circumferential side of the guard groove filled regions $23b_1$ to $23b_3$.

Accordingly, at least the upper portions of the four corners of the guard groove filled regions $23b_1$ to $23b_3$ do not form a pn junction with the conductive layer 12 and the inner circumferential and outer circumferential assistive diffusion regions $33_1$ to $33_3$ and $34_1$ to $34_3$ and the conductive layer 12 form a pn junction, and at least at the lower portions of the four corners of the guard groove filled regions $23b_1$ to $23b_3$ form a pn junction with conductive layer 12 at a position lower deeper than the inner circumferential and outer circumferential assistive diffusion regions $33_1$ to $33_3$ and $34_1$ to $34_3$.

The inner circumferential assistive diffusion region $33_1$ connected to the innermost guard groove filled region $23b_1$ is separated from the base region 32a by a fixed distance; and accordingly, the innermost guard groove filled region $23b_1$ is electrically separated from the base region 32a.

Furthermore, the guard groove filled regions $23b_1$ to $23b_3$ and the inner circumferential and outer circumferential assistive diffusion regions $33_1$ to $33_3$ and $34_1$ to $34_3$ are not connected to external terminals. On the other hand, the base region 32a, the source regions 64, and the conductive layer 12 are connected to external terminals; and the guard groove filled regions $23b_1$ to $23b_3$ and the inner circumferential and outer circumferential assistive diffusion regions $33_1$ to $33_3$ and $34_1$ to $34_3$ remain at floating potential even if a voltage is applied between the base region 32a and the conductive layer 12.

When the single crystal substrate 11 and the conductive layer 12 are structured with single crystal silicon, the plane orientation of the surfaces of the single crystal substrate 11 and the conductive layer 12 are {1 0 0}. In this specification, {1 0 0} includes all below-listed plane orientations.
(1 0 0), (0 1 0), (0 0 1), ($\bar{1}$ 0 0), (0 $\bar{1}$ 0), (0 0 $\bar{1}$)

The planar shape of the guard grooves $22b_1$ to $22b_3$ is a square or rectangular quadrilateral ring shape, and the adjacent two sides of guard grooves $22b_1$ to $22b_3$ are provided in parallel to each other.

Also, the aspect of the sides of the guard grooves $22b_1$ to $22b_3$ is aligned with respect to the plane orientation of the conductive layer 12 so that the {1 0 0} plane of the conductive layer 12 is exposed at the inner circumferential and outer circumferential ring side surfaces of the guard grooves $22b_1$ to $22b_3$.

Furthermore, the active grooves 22a are narrow rectangular shapes parallel to each other, and are provided in the longitudinal direction parallel with respect to the two parallel sides of the guard grooves $22b_1$ to $22b_3$, so that the {1 0 0} plane of the conductive layer 12 is exposed also at the four side surfaces of the active grooves 22a.

The bottom surfaces of the guard grooves $22b_1$ to $22b_3$ and the active grooves 22a are parallel to the surface of the conductive layer 12 and are thus the {1 0 0} planes.

In this manner, the plane orientation of the surfaces of the conductive layer 12 that are exposed in the guard grooves $22b_1$ to $22b_3$ and the active grooves 22a are all equally in the {1 0 0} planes; and therefore, when growing single crystal silicon inside the active grooves 22a and the guard grooves 22b, the single crystal silicon grows uniformly.

The active groove filled region 23a, guard groove filled regions 23b, and the embedded region 24 are respectively structured inside the active grooves 22a and the guard grooves $22b_1$ to $22b_3$ by epitaxially grown silicon single crystal. Accordingly, no voids are generated internally when grown uniformly.

<Manufacturing Process>

The following is a description of a manufacturing process of the above-described semiconductor device 1.

Referring to FIGS. 2a to 2c, the reference numeral 10 indicates a processed substrate to which the manufacturing process is applied. As described above, the processed substrate 10 is provided with the single crystal substrate 11 made of a silicon single crystal of the first conductivity type and the conductive layer 12 of the first conductivity type formed by epitaxial growth of silicon on the single crystal substrate 11.

The processed substrate 10 is a wafer of a diameter in the range of several inches to over ten inches, a plurality of same patterns are formed on a single wafer, and each of the patterns becomes a respective individual semiconductor device 1 through a below-described process. The following is a description of the manufacturing process focusing on one semiconductor device 1.

Firstly, a first insulating film constituted by a silicon oxide film formed by a thermal oxidation treatment is provided on the conductive layer 12, then this first insulating film is patterned, and a first mask layer 41 is formed. The first mask layer 41 is provided with a square or rectangular base diffusion opening 80a and a plurality (here, three) quadrangular ring-shaped assistive diffusion openings $80b_1$ to $80b_3$.

The base diffusion opening 80a is provided in a central position and the assistive diffusion openings $80b_1$ to $80b_3$ are provided on the periphery of the base diffusion opening 80a so as to concentrically surround the base diffusion opening 80a. The surface of the conductive layer 12 is exposed at the bottom surfaces of the base diffusion opening 80a and the assistive diffusion openings $80b_1$ to $80b_3$.

The four corners of the base diffusion opening 80a and the inner side four corners and the outer side four corners of the assistive diffusion openings $80b_1$ to $80b_3$ are not right angles and have been given a roundness of quarter circles with a radius equal to or more than 0.7 µm.

Next, when the impurity of the second conductivity type at the surface of the processed substrate 10 is irradiated, the first mask layer 41 becomes a shield (mask) and, as shown in FIGS. 3a to 3c, high concentration impurity layers 31a and $31b_1$ to $31b_3$ of the second conductivity type are respectively formed at the inner surface of the conductive layer 12 at the bottom surfaces of the openings 80a and $80b_1$ to $80b_3$.

Next, as shown in FIGS. 4a to 4c, when (the impurities of the second conductivity type contained in) the high concentration impurity layers 31a and $31b_1$ to $31b_3$ are diffused by thermal treatment, the base region 32a is formed at the bottom surface of the base diffusion opening 80a, and assistive diffusion regions $32b_1$ to $32b_3$ are respectively formed at the bottom surface of the assistive diffusion openings $80b_1$ to $80b_3$. The base region 32a and the assistive diffusion regions $32b_1$ to $32b_3$ are of the second conductivity type.

When the base region 32a and the assistive diffusion regions $32b_1$ to $32b_3$ are formed, a thermal oxide thin film is formed on the surface of the conductive layer 12 due to the thermal treatment.

The reference numeral 43 in FIGS. 4a to 4c indicates a field insulating film that is an integration of the thermal oxide thin film and the first mask layer 41.

Figure 29:
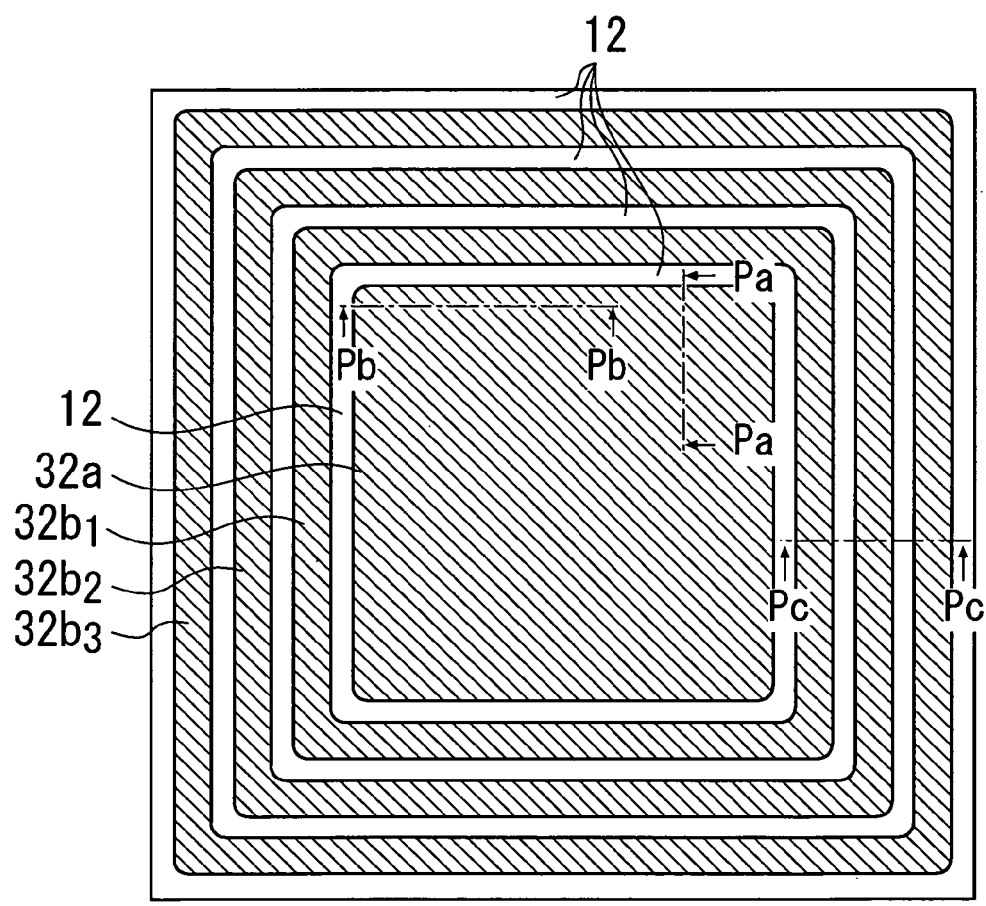
FIG. 29 is a plan view showing a diffusion structure of a semiconductor device according to the present invention and is a sectional view taken along the line A—A in FIGS. 4a, 4b, and 4c.

FIG. 29 is a sectional view taken along the line A—A in FIGS. 4a to 4c. The four corners of the base region 32a and the outer and inner four corners of the assistive diffusion regions $32b_1$ to $32b_3$ reflect the shape of the base diffusion opening 80a and the assistive diffusion openings $80b_1$ to $80b_3$ and are formed as quarter circles with a radius equal to or more than 0.7 µm.

FIGS. 4a to 4c correspond to sectional views taken along the lines Pa—Pa, Pb—Pb, and Pc—Pc in FIG. 29.

Next, the field insulating film 43 is patterned and, as shown in FIGS. 5a to 5c, a plurality of main groove window portions 81a are formed on the base region 32a and ring-shaped guard groove window portions $81b_1$ to $81b_3$ are formed one by one in concentric positions on the assistive diffusion regions $32b_1$ to $32b_3$.

The main groove window portions 81a are narrow rectangular shapes and are provided inward from the edge of the base region 32a. Accordingly, the surface of the base region 32a is exposed at the bottom surface of the main groove window portions 81a and the surface of the conductive layer 12 is not exposed.

Furthermore, the rings of the guard groove window portions $81b_1$ to $81b_3$ are quadrilateral and the four sides constituting the rings meet at right angles and do not have rounded corners.

Furthermore, the width of the guard groove window portions $81b_1$ to $81b_3$ is narrower than the width of the assistive diffusion regions $32b_1$ to $32b_3$ and is positioned centrally in the width direction of the assistive diffusion regions $32b_1$ to $32b_3$. Also, the surface of the central area in the width direction of each of the assistive diffusion regions $32b_1$ to $32b_3$ are exposed at the bottom surface of the guard groove window portions $81b_1$ to $81b_3$ and the surface of the conductive layer 12 are not exposed.

Accordingly, non-exposed portions of the assistive diffusion regions $32b_1$ to $32b_3$ are provided at positions on the outer circumferential side and inner circumferential side of the exposed portions.

Next, when areas of the base region 32a and the assistive diffusion regions $32b_1$ to $32b_3$ of the processed substrate 10 exposed at the bottom surface of the main groove window portions 81a and the guard groove window portions $81b_1$ to $81b_3$ are etched using a dry etching method with the field insulating film 43 as a mask, the active grooves 22a and the guard grooves $22b_1$ to $22b_3$ form as shown in FIGS. 6a to 6c.

The active grooves 22a and the guard grooves $22b_1$ to $22b_3$ have the same depth, and by regulating the etching time, their bottom surfaces are provided between the bottom portions of the base region 32a and the assistive diffusion regions $32b_1$ to $32b_3$ and the surface of the single crystal substrate 11.

The cross sectional form of the active grooves 22a and the guard grooves 22b is a narrow rectangular shape in which the depth is larger than the width.

The upper portions of the active grooves 22a are structured by the upper portions of the main groove window portions 81a and portions below the main groove window portions 81a are structured by grooves formed in the processed substrate 10. Similarly, the upper portions of the guard grooves $22b_1$ to $22b_3$ are structured by the guard groove window portions $81b_1$ to $81b_3$ and portions below the guard groove window portions $81b_1$ to $81b_3$ are structured by grooves formed in the processed substrate 10.

Accordingly, the field insulating film 43 is exposed at the upper portions of the inner circumferential of the active grooves 22a and the guard grooves $22b_1$ to $22b_3$, and the conductive layer 12 is exposed at the lower portions. The base region 32a and the assistive diffusion regions $32b_1$ to $32b_3$ are exposed in central positions between the field insulating film 43 and the conductive layer 12.

The depth of the guard grooves $22b_1$ to $22b_3$ is deeper than the assistive diffusion regions $32b_1$ to $32b_3$, and the assistive diffusion regions $32b_1$ to $32b_3$ are respectively separated from the inner circumferential assistive diffusion regions $33_1$ to $33_3$ and the outer circumferential assistive diffusion regions $34_1$ to $34_3$ by the guard grooves $22b_1$ to $22b_3$.

The active grooves 22a are provided inward from the edge of the base region 32a; and the base region 32a is not separated by the active grooves 22a.

Figure 30:
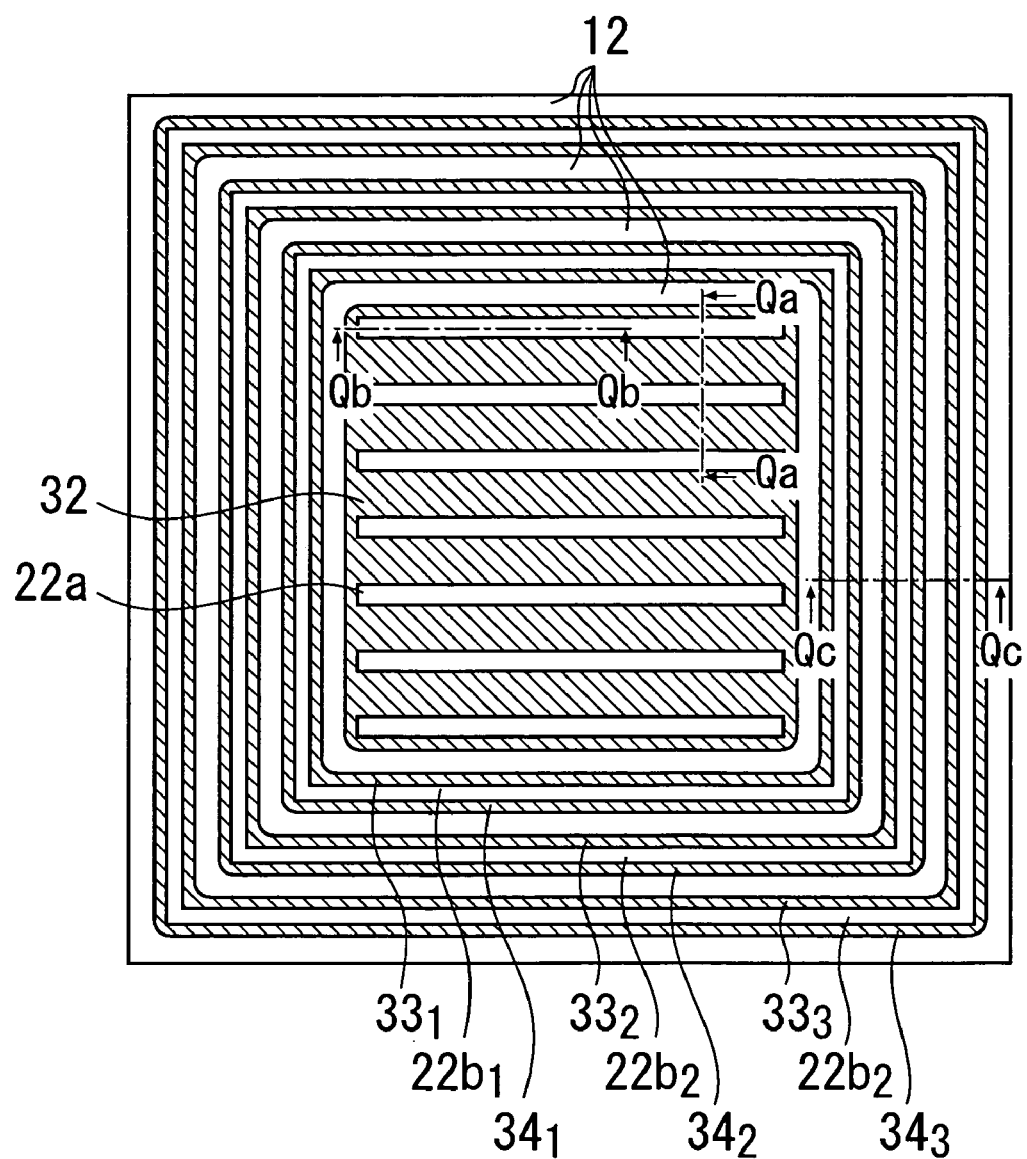
FIG. 30 is a plan view showing a diffusion structure of a semiconductor device according to the present invention and is a sectional view taken along the line B—B in FIGS. 6a, 6b, and 6c.

FIG. 30 is a sectional view taken along the line B—B in FIGS. 6a to 6c. Conversely, FIGS. 6a to 6c correspond to sectional views taken along the lines Qa—Qa, Qb—Qb, and Qc—Qc in FIG. 30.

The planar shape of the active grooves 22a reflects the planar shape of the main groove window portions 81a, being a narrow rectangular shape, and the planar shape of the guard grooves $22b_1$ to $22b_3$ reflects the planar shape of the guard groove window portions $81b_1$ to $81b_3$ so that the inner circumferential and outer circumferential of the four corners are respectively right-angle quadrangular ring shapes.

The active grooves 22a are parallel to each other and parallel with respect to two sides of the guard grooves $22b_1$ to $22b_3$.

The width of the grooves 22a and $22b_1$ to $22b_3$ are equivalent in size to each other and, furthermore, the distance between adjacent active grooves 22a and the distance between adjacent guard grooves $22b_1$ to $22b_3$ are equivalent.

The ends of the active grooves 22a are not in contact with the innermost guard groove $22b_1$, and the distance between the active groove 22a and the guard groove $22b_1$ that are adjacent, the distance between the active grooves 22a, and the mutual distances between the guard grooves $22b_1$ to $22b_3$ are equivalent.

The direction in which the active grooves 22a are provided and the directions in which the four sides of the guard grooves $22b_1$ to $22b_3$ are provided are aligned with respect to the crystal orientation of the conductive layer 12, extending in the {1 0 0} direction.

Since the cross sectional form of the grooves 22a and $22b_1$ to $22b_3$ is rectangular, the {1 0 0} plane is exposed at the side faces of the grooves 22a and $22b_1$ to $22b_3$. Furthermore, since the bottom surfaces of the grooves 22a and $22b_1$ to $22b_3$ are parallel to the surface, the {1 0 0} plane is also exposed at the bottom surfaces.

In this state, the semiconductor single crystal that constitutes the processed substrate 10 is exposed in the grooves 22a and $22b_1$ to $22b_3$ and the surface of the processed substrate 10 is covered by the field insulating film 43.

When a semiconductor single crystal doped with impurities of the second conductivity type is grown using an epitaxial growth technique on the surfaces of the semiconductor single crystal exposed at the bottom surfaces and side surfaces of the grooves 22a and $22b_1$ to $22b_3$, the grooves 22a and $22b_1$ to $22b_3$ are filled with the semiconductor single crystal that is grown.

As shown in FIGS. 7a to 7c, the active groove filled regions 23a are formed inside the active grooves 22a by the semiconductor single crystal; thereby forming the guard groove filled regions $23b_1$ to $23b_3$ inside the guard grooves $22b_1$ to $22b_3$. Here, single crystal silicon is used as the semiconductor single crystal.

Figure 31:
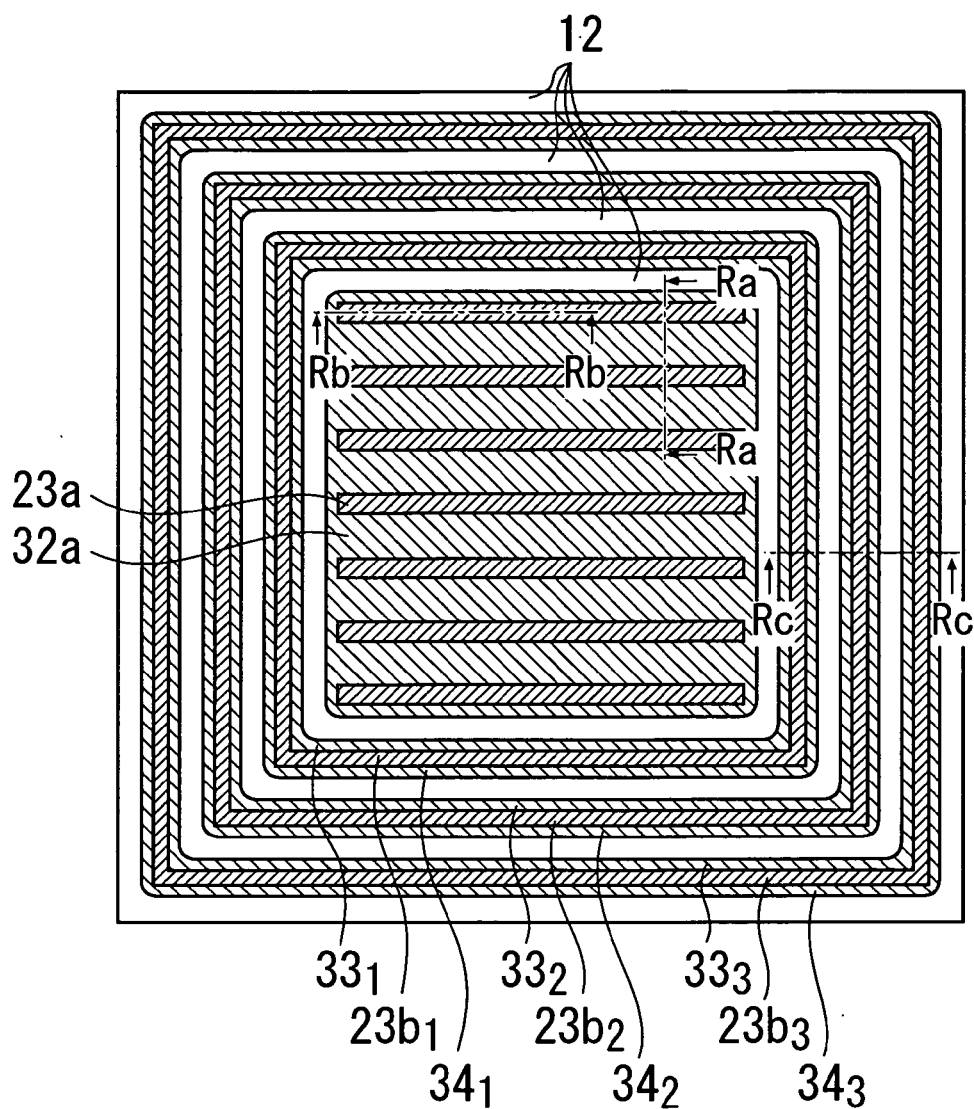
FIG. 31 is a plan view showing a diffusion structure of a first embodiment of a semiconductor device according to the present invention and is a sectional view taken along the line C—C in FIGS. 7a, 7b, and 7c.

FIG. 31 is a sectional view taken along the line C—C in FIGS. 7a to 7c. Conversely, FIGS. 7a to 7c correspond to sectional views taken along the lines Ra—Ra, Rb—Rb, and Rc—Rc in FIG. 31.

Immediately after the filled regions 23a and $23b_1$ to $23b_3$ are formed, the upper end portions thereof bulge above the surface of the field insulating film 43 that is used as a mask.

Next, the bulging portions are removed by etching and, as shown in FIGS. 8a to 8c, the heights of the filled regions 23a and $23b_1$ to $23b_3$ being made substantially concordant with the height of the field insulating film 43. For example, the upper portions of the filled regions 23a and $23b_1$ to $23b_3$ are positioned slightly lower than the surface of the field insulating film 43.

Next, as shown in FIGS. 9a to 9c, a second mask layer 44 is formed on the upper portions of the filled regions 23a and $23b_1$ to $23b_3$ and the surface of the field insulating film 43.

As shown in FIGS. 10a to 10c, patterning is performed on the second mask layer 44 to form openings 82 on partial regions of the active groove filled region 23a. An insulating film such as a silicon oxide film using a CVD technique or the like is used for the second mask layer 44.

Here, the openings 82 are not provided at the central portions and edge portions of the active groove filled region 23a but are left covered by the second mask layer 44; and the openings 82 are provided on other portions of the active groove filled region 23a so that the surface of the active groove filled region 23a is exposed at the bottom surface of the openings 82. The guard groove filled regions $23b_1$ to $23b_3$ are left covered by the second mask layer 44 and the surfaces thereof are not exposed.

In this state, the semiconductor single crystal constituting the filled regions 23a and $23b_1$ to $23b_3$ is etched with a gas that tends not to etch the second mask layer 44, and the exposed portions of the active groove filled region 23a are removed to a position lower than the bottom surface of the base region 32a.

As shown in FIGS. 11a and 11b, with this etching, the gate grooves 83 are formed by portions in which the active groove filled region 23a is removed, and the embedded regions 24 are formed on the bottom surface of the active grooves 22a by residual portions of the active groove filled region 23a.

Since portions protected by the second mask layer 44 on the active groove filled region 23a are not etched, the active groove filled region 23a remains at edge portions and central portions inside the active grooves 22a, while the embedded regions 24 are positioned on the bottom surfaces of the active grooves 22a therebetween, and the gate grooves 83 are formed at the upper portions of the embedded regions 24. Here, two gate grooves 83 are formed inside a single active groove. The gate grooves 83 are sandwiched by the active groove filled region 23a.

Accordingly, on the side surfaces of the gate grooves 83 extending in a longitudinal direction, although the conductive layer 12 is exposed at the lower portions and the base region 32a is exposed at the upper portions, the active groove filled region 23a are exposed at the side faces of the side edge positions. The surface of the upper edge portion of the embedded regions 24 are exposed at the bottom surfaces of the gate grooves 83.

The active groove filled region 23a and the embedded regions 24 are in contact. Moreover, the active groove filled region 23a and the base region 32a are also in contact; and accordingly, the active groove filled region 23a, the embedded regions 24, and the base region 32a are electrically connected.

The upper end portions of the active groove filled region 23a are positioned at a substantially same height as the surface of the field insulating film 43, at least at a height higher than the boundary between the processed-substrate 10 and the field insulating film 43.

The guard groove filled regions $23b_1$ to $23b_3$ are protected by the second mask layer 44; and therefore, they are not etched and the upper end portions thereof are positioned at a substantially same height as the surface of the field insulating film 43 (FIG. 11c).

Figure 32:
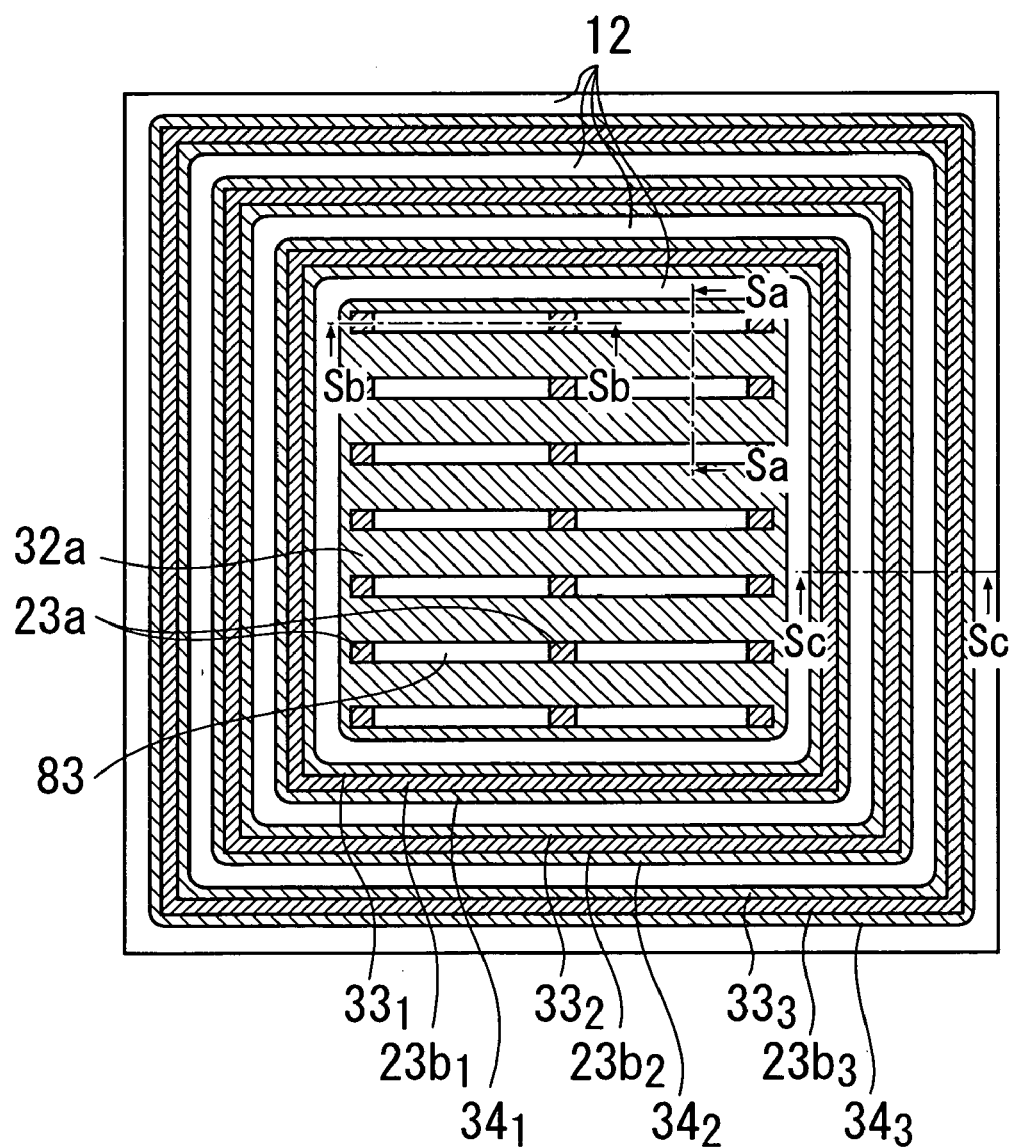
FIG. 32 is a plan view showing a diffusion structure of a semiconductor device according to the present invention and is a sectional view taken along the line D—D in FIGS. 11a, 11b, and 11c.

FIG. 32 is a sectional view taken along the line D—D in FIGS. 11a to 11c. Conversely, FIGS. 11a to 11c are sectional views taken along the lines Sa—Sa, Sb—Sb, and Sc—Sc in FIG. 32.

Next, the second mask layer 44 is entirely removed by etching to expose the surfaces of the active groove filled region 23a and the guard groove filled regions $23b_1$ to $23b_3$ as shown in FIGS. 12a, 12b and 12c, after which the field insulating film 43 is partially etched such that the field insulating film 43 remains on portions outward from the edges of the base region 32a and portions inward from the edges of the base region 32a by a fixed distance as shown in FIG. 12a; and the surface of portions of the base region 32a inward from there are exposed.

When the processed substrate 10 undergoes thermal oxidation processing in this state, the gate insulating film 45 is formed on the surface of the processed substrate 10 including the side surfaces and bottom surfaces of the gate grooves 83 as shown in FIGS. 13a to 13c, and the bottom surfaces and side surfaces of the gate grooves 83 are covered by the gate insulating film 45. The gate insulating film 45 is in contact with the base region 32a and the conductive layer 12 at side surface portions extending in the longitudinal direction of the gate grooves 83, is in contact with the active groove filled region 23a at the side surfaces of the ends thereof, and in contact with the embedded regions 24 at the bottom surface of the gate grooves 83.

Figure 33:
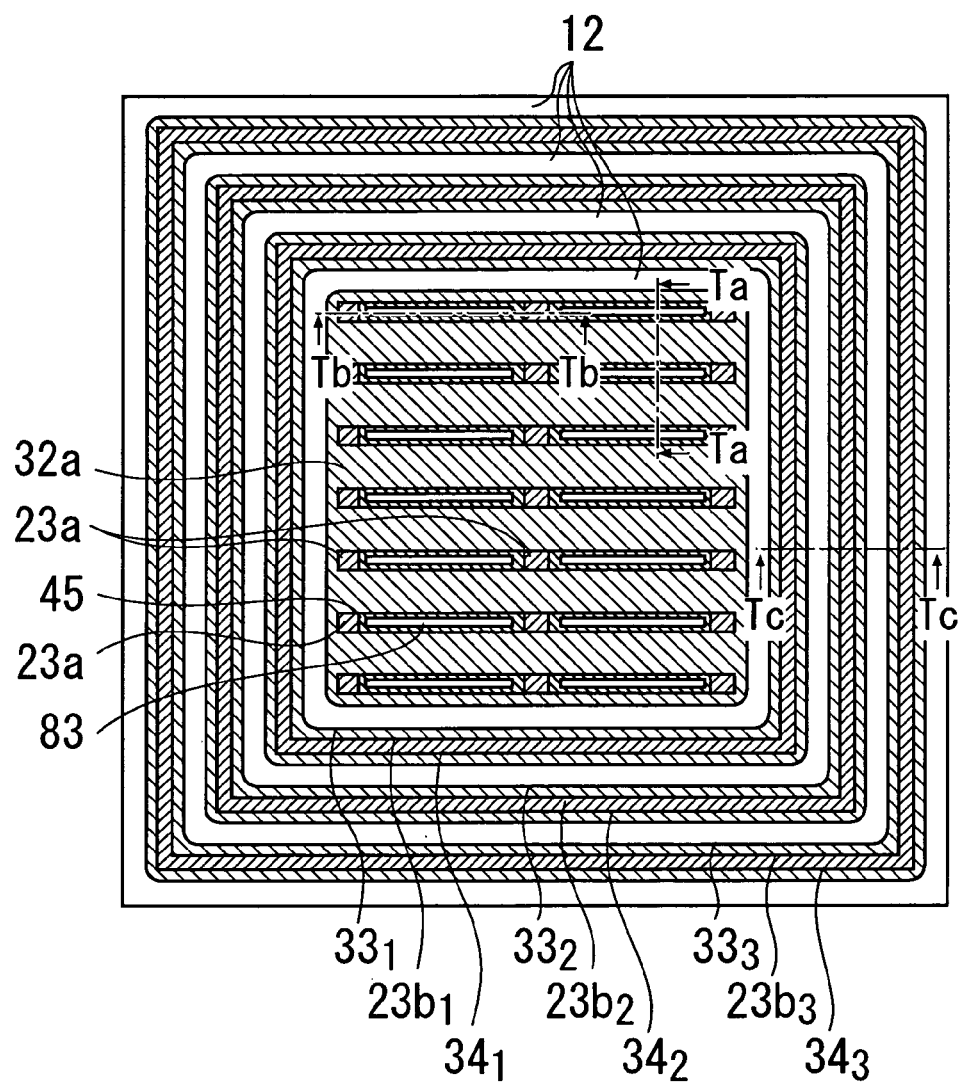
FIG. 33 is a plan view showing a diffusion structure of a semiconductor device according to the present invention and is a sectional view taken along the line E—E in FIGS. 13a, 13b, and 13c.

FIG. 33 is a sectional view taken along the line E—E in FIGS. 13a to 13c. Conversely, FIGS. 13a to 13c are sectional views taken along the lines Ta—Ta, Tb—Tb, and Tc—Tc in FIG. 33.

Here the gate insulating film 45 is a silicon oxide film formed by a thermal oxidation technique, but other types of insulating film can be used (such as, a silicon nitride film formed by a CVD technique or the like).

As shown in FIGS. 14a to 14c, when a conductive material is deposited on the surface of the gate insulating film 45 by a CVD technique or the like to form a conductive thin film 46, the gate grooves 83 are internally filled with the conductive thin film 46. The conductive material that constitutes the conductive thin film 46 is thereby constituted by polysilicon doped with impurities.

Next, the conductive thin film 46 is etched and, as shown in FIGS. 15a to 15c, portions inside the gate grooves 83 remain and other portions are removed so that the gate electrode plugs 48 are structured by the portions inside the gate grooves 83.

Figure 34:
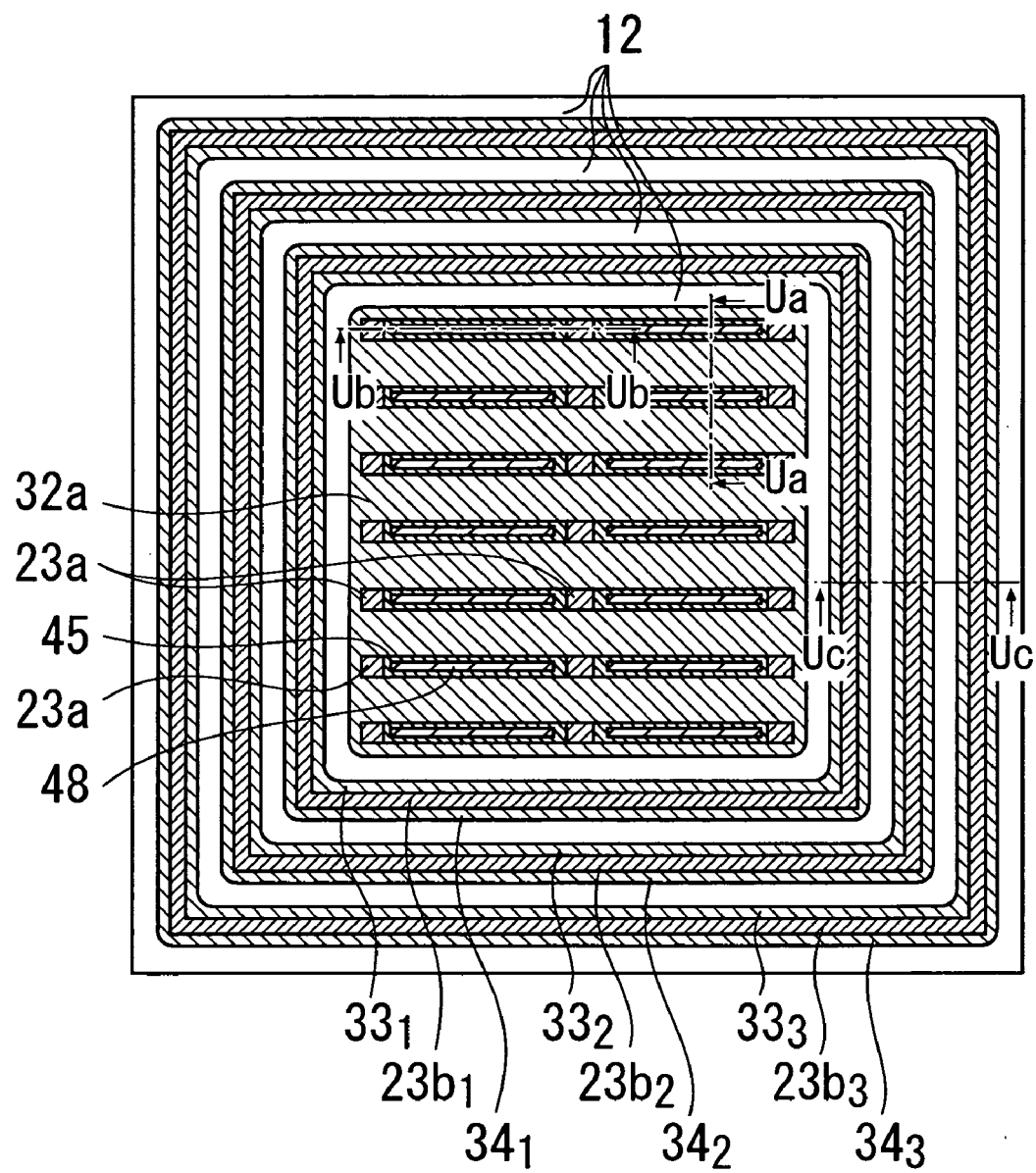
FIG. 34 is a plan view showing a diffusion structure of a semiconductor device according to the present invention and is a sectional view taken along the line F—F in FIGS. 15a, 15b, and 15c.

FIG. 34 is a sectional view taken along the line F—F in FIGS. 15a to 15c. Conversely, FIGS. 15a to 15c are sectional views taken along the lines Ua—Ua, Ub—Ub, and Uc—Uc in FIG. 34.

Here, the gate electrode plugs 48 formed inside the gate grooves 83 are separated from each other, but it is also possible to connect the gate electrode plugs 48 to each other with a wiring film by using a patterned resist film when etching the conductive thin film 46 so that the conductive thin film 46 outside the gate grooves 83 are kept partially remaining so as to constitute a wiring film.

Next, the gate insulating film 45 is etched and after at least a portion of the surface of the base region 32a is exposed as shown in FIG. 16a, thermal oxidation processing is carried out to form a buffer layer 50 made of silicon oxide film on the surface of the base region 32a as shown in FIG. 17a.

At this time, as shown in FIGS. 16b and 16c, the surfaces of the active groove filled region 23a and the guard groove filled regions $23b_1$ to $23b_3$ are temporarily exposed; and the buffer layer 50 is formed on those surfaces too, as shown in FIGS. 17b and 17c.

Next, a resist film is provided on the surface of the buffer layer 50 and patterning is performed. The reference numeral 51 in FIGS. 18a to 18c indicates a patterned resist film.

The resist film 51 is provided with openings 52a and 52b respectively on positions between the adjacent gate grooves 83 and positions on the active groove filled region 23a.

The buffer layer 50 is exposed at the bottom surfaces of the openings 52a and 52b; and when the ions of the impurities of the second conductivity type are irradiated in this state, the ions of the impurities of the second conductivity type penetrate the buffer layer 50 positioned at the bottom surfaces of the openings 52a and 52b, and a high concentration impurity layer of the second conductivity type forms at the inner surfaces of the base region 32a and the active groove filled region 23a positioned directly below the bottom surfaces of the openings 52a and 52b.

The reference numeral 61a in FIG. 18a indicates the high concentration impurity layer of the second conductivity type formed at the inner surface of the base region 32a and the reference numeral 61b in FIG. 18b indicates the high concentration impurity layer formed on the of the active groove filled region 23a. The high concentration impurity layer of the second conductivity type is not formed at other areas (FIG. 18c).

The width of the high concentration impurity layer 61a of the second conductivity type at the inner surface of the base region 32a is shorter than the distance between the gate grooves 83, and the base region 32a remains between the high concentration impurity layer 61a and the gate insulating film 45.

Next, after the resist film 51 is removed and the surface of the buffer layer 50 is exposed, another resist layer is formed, and then patterning is performed.

The reference numeral 53 in FIGS. 19a to 19c indicates a patterned resist film. The resist film 53 is provided with openings 54 in positions on the surface of the buffer layer 50 between the high concentration impurity layer 61a of the second conductivity type inside the base region 32a and the gate grooves 83. The surface of the buffer layer 50 is exposed at the bottom surfaces of the openings 54 and when the impurities of the first conductivity type are irradiated, the buffer layer 50 at the bottom surface of the openings 54 is penetrated and a high concentration impurity layers 62 of the first conductivity type is formed in positions directly below the bottom surfaces of the openings 54.

In order that the high concentration impurity layers 62 of the first conductivity type do not contact the active groove filled region 23a, the openings 54 are not formed in positions abutting on the active groove filled region 23a.

Furthermore, as shown in FIGS. 19a to 19c, the openings 54 are not formed on the gate electrode plugs 48 and the guard groove filled regions $23b_1$ to $23b_3$, so that the high concentration impurity layers of the first conductivity type are not formed thereon.

Next, after the resist film 53 is stripped and the surface of the buffer layer 50 is exposed, an insulative interlayer insulating film 55 is formed on the buffer layer 50 as shown in FIGS. 20a to 20c using a CVD technique or the like.

Following this, when thermal processing is carried out and impurities of the first conductivity type and impurities of the second conductivity type in the high concentration impurity layers 61a, 61b, and 62 are diffused, the source regions 64 of the first conductivity type and the ohmic regions 63a having a high surface concentration of impurities of the second conductivity type are formed in the base region 32a by the first conductivity type impurities as shown in FIG. 21a.

At this time, ohmic regions 63b are also formed (FIG. 21b) from the high concentration impurity layer 61b of the second conductivity type, in the active groove filled region 23a.

Figure 42:
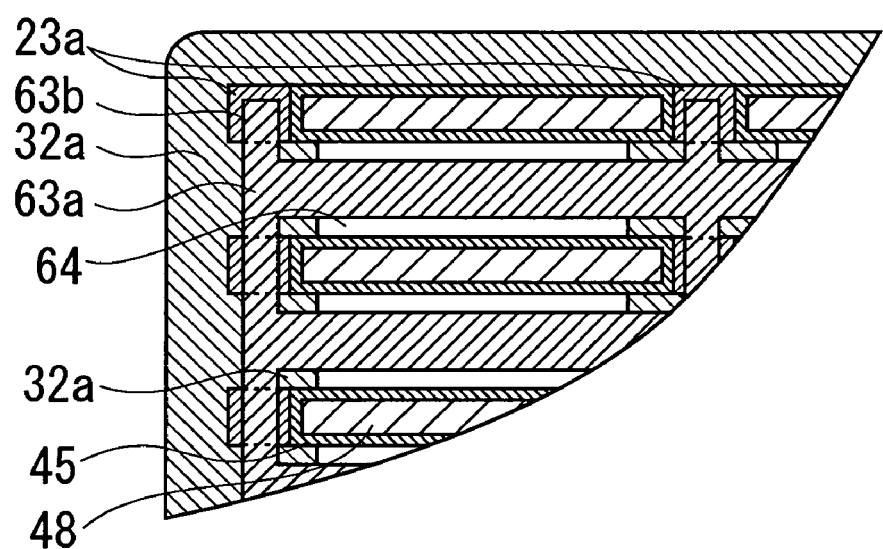
FIG. 42 is a plan view showing patterns of ohmic regions.
Figure 43:
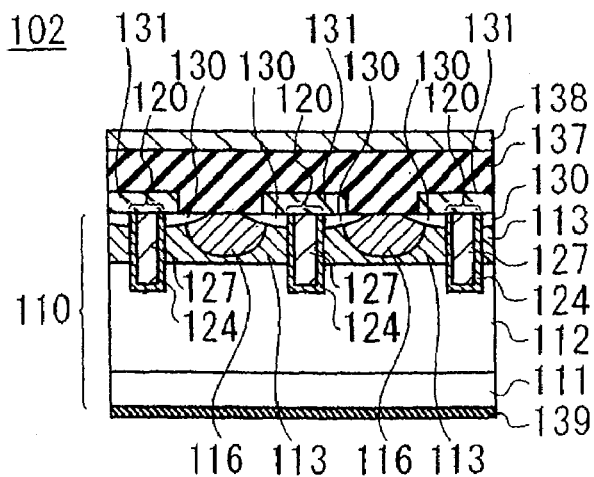
FIG. 43 is a sectional view for illustrating a previous MOSFET diffusion structure.
Figure 44:
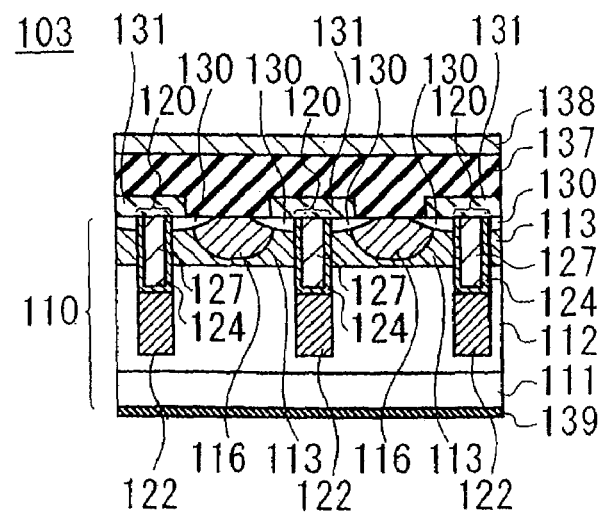
FIG. 44 is a sectional view for illustrating a previous MOSFET diffusion structure that has been improved.

FIG. 42 is a plan view showing patterns of the ohmic regions 63a and 63b. There is no change in the guard groove filled regions $23b_1$ to $23b_3$ (FIG. 21c) Next, patterning is performed on the interlayer insulating film 55 and, as shown in FIG. 22a, source openings 56a are formed on the ohmic regions 63a and the source regions 64, and gate openings 56b are formed on the gate electrode plugs 48. The interlayer insulating film 55 remains between the source openings 56a and the gate openings 56b so that the source openings 56a and the gate openings 56b are separated.

Furthermore, as shown in FIG. 22b, when the source openings 56a and the gate openings 56b are formed, a ground opening 56c is formed on a portion in which the ohmic regions 63b of the active groove filled region 23a is formed. The ground opening 56c may be linked with the source openings 56a, but the interlayer insulating film 55 is provided between the ground opening 56c and the gate openings 56b so that they are separated.

No openings are formed on the guard groove filled regions $23b_1$ to $23b_3$ (FIG. 22c).

Next, as shown in FIGS. 23a to 23c, a metal thin film 58 having aluminum as a principal constituent is formed by a sputtering technique or the like on the surface of the side of the processed substrate 10 on which the source openings 56a and the gate openings 56b are formed; and patterning is performed on this metal thin film 58.

With this patterning, as shown in FIGS. 24a and 24b, source electrode films 58a that is in contact with the source regions 64 exposed at the bottom surfaces of the source openings 56a, the ohmic regions 63a and the ohmic regions 63b of the active groove filled region 23a exposed at the bottom surfaces of the ground opening 56c to form ohmic junctions; and gate electrode films 58b that is in contact with the gate electrode plugs 48 exposed at the bottom surfaces of the gate openings 56b to form ohmic junctions are formed from the metal thin film 58. At this time, as shown in FIG. 24c, the metal thin film 58 on the upper portions of the guard groove filled regions $23b_1$ to $23b_3$ is removed.

Next, as shown in FIGS. 25a to 25c, after an insulative protection film 68 is formed on the surface of the processed substrate 10 using a CVD technique or the like, a drain electrode film 71 is formed on the surface of the single crystal substrate 11 exposed at the back surface of the processed substrate 10 as shown in FIGS. 26a to 26c; thereby obtaining a semiconductor device 1 according to the present invention. A metal that forms the ohmic junctions with the single crystal substrate 11 is selected as the material constituting the drain electrode film 71.

The sectional views taken along the line G—G in FIGS. 26a to 26c are as indicated in FIG. 1.

A plurality of the semiconductor devices 1 are formed on a single processed substrate 10, and in the dicing step, which is a step after the step of forming the drain electrode film 71, after the processed substrate 10 is cut to be separated into a plurality of the semiconductor devices 1, the drain electrode film 71 is fixed onto a lead frame using a low melting point metal or a conductive paste material.

Then, a surface of a gate pad made from a portion of the gate electrode film 58b and a surface of a source pad made from a portion of the source electrode film 58a are connected to separate lead frames by wire bonding or the like; and the semiconductor device 1 undergoes molding.

Finally, the lead frames are cut to separate the lead connected to the drain electrode film 71, the lead connected to the gate pad, and the lead connected to the source pad, and the semiconductor device 1, which has been molded with resin, is obtained.

In the resin-sealed semiconductor device 1, the leads thereof are connected to an electric circuit, the source electrode film 58a is connected to the ground potential on using, and when a voltage equal to or higher than a threshold voltage is applied to the gate electrode plugs 48 while a positive voltage is applied to the drain electrode film 71, portions of the base region 32a positioned between the source regions 64 and the conductive layer 12 and in contact with the gate insulating film 45 are inverted to the first conductivity type; and the source regions 64 and the conductive layer 12 are connected by the inversion layer thus formed so that electric current flows from the drain electrode film 71 to the source electrode film 58a.

When the first conductivity type is the n-type and the second conductivity type is the p-type, the polarity of the voltage when conducted is such that the source electrode film 58a is the ground potential and the drain electrode film 71 and the gate electrode plugs 48 are positive voltages.

Next, when the electric potential of the gate electrode plugs 48 becomes below the threshold voltage, the inversion layer is extinguished and the semiconductor device 1 shifts to an isolated state and electric current no longer flows.

The pn junction between the base region 32a and the conductive layer 12 is under a reverse bias both when the semiconductor device 1 is in a conductive state and when it is in an isolated state, and a depletion layer expands from the pn junction inward toward the base region 32a and inward toward the conductive layer 12.

In a semiconductor device 1 of the present invention, the embedded regions 24 are electrically connected to the source electrode film 58a via the active groove filled region 23a, and the embedded regions 24 has the same electric potential as the source regions 64 and the base region 32a without having a floating potential.

When a voltage of a polarity under which the pn junction thereof is reversely biased is applied between the base region 32a and the conductive layer 12, the pn junction between the embedded regions 24 and the conductive layer 12 is also reversely biased. Accordingly, a depletion layer expands inside the conductive layer 12 from both the base region 32a and the embedded regions 24. As a result, the inside of the conductive layer 12 of portions higher than the bottom portions of the embedded regions 24 and directly below the base region 32a can be easily completely depleted.

When areas of the conductive layer 12 that are directly below the base region 32a and higher than the bottom surfaces of the embedded regions 24 are depleted entirely, the inside of the embedded regions 24 is made to be depleted entirely by setting to optimal values such factors as the concentration of impurities in the conductive layer 12 and the embedded regions 24 and the distances and widths between the embedded regions 24, thus the electric field strength of positions directly below the base region 32a can be reduced, thereby improving the withstanding voltage of the active regions.

On the other hand, the guard groove filled regions $23b_1$ to $23b_3$ and the inner circumferential and outer circumferential assistive diffusion regions $33_1$ to $33_3$ and $34_1$ to $34_3$ are at a floating potential in the withstanding voltage region; and the depletion layer that expands laterally from the base region 32a and the embedded regions 24 first reaches the innermost inner circumferential assistive diffusion region $33_1$.

Then, by the reaching of the depletion layer, the electric potential of the innermost inner circumferential assistive diffusion region $33_1$ and the innermost guard groove filled region $23b_1$ and outer circumferential assistive diffusion regions $34_1$ connected thereat are stabilized so that the depletion layer begins to expand from these also.

In this manner, the depletion layer expands from the inner side to the outer side in order from the guard groove filled regions $23b_1$ to $23b_3$ to the inner circumferential and outer circumferential assistive diffusion regions $33_1$ to $33_3$ and $34_1$ to $34_3$.

This reduces the electric field intensity of regions in which the guard groove filled regions $23b_1$ to $23b_3$ are provided, and improves the withstanding voltage of the withstanding voltage region.

Here, although the four sides of the guard groove filled regions $23b_1$ to $23b_3$ meet at substantial right angles and the four corners are not rounded, outer circumferential assistive diffusion regions $34_1$ to $34_3$ that are rounded are provided in the four corners, and in the vicinity of the surface of the conductive layer 12, the conductive layer 12 forms a pn junction with the outer circumferential assistive diffusion regions $34_1$ to $34_3$ without forming a pn junction with the guard groove filled regions $23b_1$ to $23b_3$.

Accordingly, the form of the pn junction is closer to a cylindrical junction or a planar junction than a spherical junction, thereby greatly reducing the electric field intensity.

The {1 0 0} plane of the processed substrate 10 is exposed at the bottom surfaces and side surfaces of the active grooves 22a and the guard grooves $22b_1$ to $22b_3$, and the active groove filled region 23a and the guard groove filled regions $23b_1$ to $23b_3$ grow from those surfaces. Accordingly, there are no defects in the embedded regions 24 and the guard groove filled regions 23b such that the withstanding voltage is not reduced.

Furthermore, in a semiconductor device according to the present invention, the upper portions of the guard groove filled regions $23b_1$ to $23b_3$ are higher than the surface of the processed substrate 10 (the surfaces of the conductive layer 12 and the inner circumferential and outer circumferential assistive diffusion regions $33_1$ to $33_3$ and $34_1$ to $34_3$), and are provided inside the field insulating film 43. With this structure, compared to when the upper ends of the guard groove filled regions are the same height as the surface of the processed substrate 10, the electric field intensity is reduced at the withstanding voltage region such that the withstanding voltage increases.

It should be noted that description was given above with the first conductivity type as the n-type and the second conductivity type as the p-type, but in the above-described embodiment and the embodiments to be described below, the first conductivity type may be set as the p-type and the second conductivity type as the n-type.

Furthermore, the semiconductor device 1 of the above-described embodiment is a MOSFET, but the semiconductor device according to the present invention is not limited to this and includes, for example, a pn junction type IGBT (insulated gate bipolar transistor) and a Schottky junction type IGBT.

The reference numeral 2 in FIGS. 27a to 27c indicates a semiconductor device of a pn junction type IGBT according to the present invention.

In the semiconductor device 2, instead of the single crystal substrate 11, a collector layer 11' is used that is a conductivity type (second conductivity type) opposite to that of the conductive layer 12. Other areas of the structure are the same structure as the semiconductor device 1 in the above-described embodiment.

The collector layer 11' forms a pn junction with the conductive layer 12, and when the semiconductor device 2 is conductive, the pn junction is subjected to a forward bias, and a minority carrier is injected from the collector layer 11' into the conductive layer 12 so that the conduction resistance is reduced.

Reference numeral 71' in FIGS. 27a to 27c indicates a collector electrode film that forms an ohmic junction with the collector layer 11'.

Reference numeral 3 in the FIGS. 28a to 28c indicates a semiconductor device of the present invention in the case of a Schottky barrier type IGBT.

In the semiconductor device 3, after the single crystal substrate 11 is removed by a polishing process or the like to expose the surface of the conductive layer 12, which has a lower concentration than the single crystal substrate 11, a Schottky electrode film 72 is formed on that surface.

At least a portion of the Schottky electrode film 72 in contact with the conductive layer 12 is a material that forms a Schottky junction with the conductive layer 12 (for example, chromium or the like). Other areas of the structure are the same structure as the semiconductor device 1 of the first embodiment.

The polarity of the Schottky junction is a polarity by which forward bias is also applied to the Schottky junction when an inversion layer is formed and a voltage of the polarity in which the semiconductor device 3 is conductive is applied, and by applying a forward bias to the Schottky junction, a minority carrier is injected from the Schottky electrode film 72 into the conductive layer 12 such that the conduction resistance is reduced.

The single crystal substrate 11 has a low concentration, and a Schottky electrode film may be formed on the surface of the single crystal substrate 11 when capable of forming a Schottky junction with the Schottky electrode film 72.

Next, the reference numeral 4 in the FIGS. 37*a* to 37*c* indicates a low conduction resistance type semiconductor device.

Below the base region 32*a* of the semiconductor device 1 of the first embodiment, the semiconductor device 4 is provided with a low resistance region 29 of the first conductivity type that has a higher concentration than the conductive layer 12. The other structures are the same as the semiconductor device 1 of the first embodiment.

To describe the positional relationship between the low resistance region 29 and the base region 32*a*, firstly, a low resistance region 28 of the first conductivity type is formed on a surface area smaller than the base region within the active region as shown in FIGS. 38*a* and 38*b* by injecting and diffusing impurities of the first conductivity type into the conductive layer 12. The low resistance region 28 is not formed within the withstanding voltage region.

FIGS. 38*a* to 38*c* show a state in which a surface of the conductive layer 12 including the low resistance region 28 is exposed.

Next, as shown in FIGS. 39*a* to 39*c*, a square or rectangular base diffusion opening 80*a* and a plurality (here, three) quadrangular ring-shaped assistive diffusion openings 80*b*$_1$ to 80*b*$_3$, which concentrically surround the base diffusion opening 80*a*, are formed.

The low resistance region 28 is positioned on the inner side of the innermost assistive diffusion opening 80*b*$_1$, and the base diffusion opening 80*a* is broader than the surface area of the surface of the low resistance region 28. Then, the entire surface of the low resistance region 28 and peripheral regions within a fixed range from the outer periphery of the low resistance region 28 are exposed at the bottom surface of the base diffusion opening 80*a*.

When impurities of the second conductivity type are implanted under this condition, the impurities of the second conductivity type are injected below the bottom surface of the openings 80*a* and 80*b*$_1$ to 80*b*$_3$, and the surface of the low resistance region 28 becomes of the second conductivity type. As a result, as shown in FIGS. 40*a* and 40*b*, the high concentration impurity layers 31*a* and 31*b*$_1$ to 31*b*$_3$ of the second conductivity type are respectively formed at the inner surfaces below the bottom surfaces of the base diffusion opening 80*a* and the assistive diffusion openings 80*b*$_1$ to 80*b*$_3$.

Then, when thermal processing is carried out, the high concentration impurity layers 31*a* and 31*b*$_1$ to 31*b*$_3$ of the second conductivity type are diffused and the base region 32*a* and the assistive diffusion regions 32*b*$_1$ to 32*b*$_3$ are respectively formed in the corresponding positions.

In this manner, the upper portion of the low resistance region 28 is transformed to a diffusion region of the second conductivity type by the base region 32*a*; and, as shown in FIGS. 41*a* and 41*b*, the low resistance region 29 made of residual portions of the low resistance region 28 is formed in a position directly under the base region 32*a*.

The outer perimeter of the low resistance region 29 is provided inward from the edge of the base region 32*a*, and the low resistance region 29 is not exposed at the surface of the conductive layer 12. The low resistance region 29 is not formed under the assistive diffusion regions 32*b*$_1$ to 32*b*$_3$ (FIG. 41*c*)

When the semiconductor device 4 (FIGS. 37*a* to 37*c*) is conductive, electric current flows via the low resistance region 29, and therefore the conduction resistance is made small.

Figure 36:
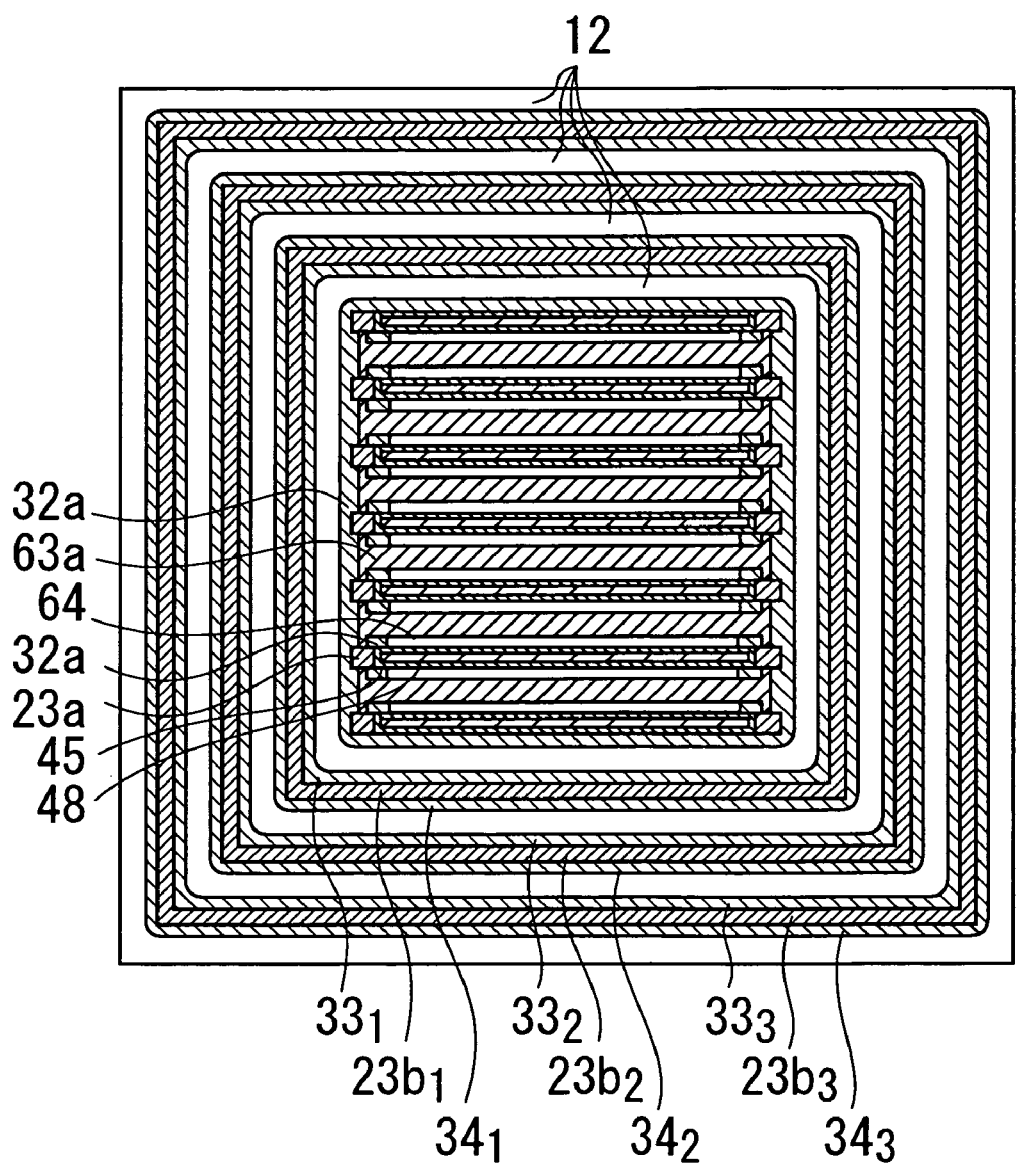
FIG. 36 is a plan view of another embodiment of a semiconductor device according to the present invention.

In the above-described embodiments, after the embedded regions 24 are formed, the active groove filled region 23*a* remains on the sides and central position of the narrow active grooves 22*a* (the gate grooves 83), but the present invention is not limited to this and the active groove filled region may be provided in the active grooves 22*a* so that the embedded regions 24 positioned below the gate grooves 83 have the same electric potential as the source electrode film 58*a*. For example, the active groove filled region may be provided on side edge positions and not provided centrally in the longitudinal direction as shown in a semiconductor device 5 in FIG. 36.

Furthermore, in the above-described embodiments, the four sides of the guard grooves 22*b*$_1$ to 22*b*$_3$ met at right angles, but the present invention is not limited to this, and roundness may be applied to the four corners of the guard grooves 22*b*$_1$ to 22*b*$_3$. Moreover, it is also possible to use a polygonal form.

The above-described active groove filled region 23*a* and the guard groove filled regions 23*b* are respectively structured by single crystal silicon epitaxially grown inside the active grooves 22*a* and the guard grooves 22*b*$_1$ to 22*b*$_3$, but it is also possible to grow a polycrystal instead of the single crystal and use polycrystalline filled regions.

According to the present invention, a semiconductor device of a high withstanding voltage can be obtained.

What is claimed is:

1. A semiconductor device, comprising:
   a processed substrate having a conductive layer of a first conductivity type;
   a base region of a second conductivity type formed at an inner surface of the conductive layer;
   a gate groove formed in a position in which the base region of the conductive layer is provided, wherein the gate groove with a bottom position thereof is formed deeper than a bottom surface of the base region;
   a gate insulating film provided at a side surface of the gate groove;
   a gate electrode plug provided inside the gate groove and being in contact with the gate insulating film;
   a source region of the first conductivity type provided in a position in contact with the gate insulating film within the base region, the source region being separated from the conductive layer by the base region;
   an embedded region of the second conductivity type provided in a position below the gate groove and being insulated from the gate electrode plug;
   a source electrode film in contact with the source region; and
   an active groove filled region of the second conductivity type in contact with the embedded region and electrically shorted with the source electrode film,
   wherein the gate groove is formed narrow, and the active groove filled region is provided at both ends in a longitudinal direction thereof.

2. The semiconductor device according to claim 1, wherein a surface of the active groove filled region is in contact with the source electrode film.

3. The semiconductor device according to claim 2, wherein an impurity layer of the second conductivity type is formed by diffusion at a portion in contact with the source electrode film at an inner surface of the active groove filled region.

4. The semiconductor device according to claim 1, wherein the source electrode film is in contact with the base region and the active groove filled region is in contact with the base region.

5. The semiconductor device according to claim 1, wherein the processed substrate includes an active groove formed therein, and wherein the embedded region is provided on a bottom surface of the active groove, the gate groove is structured by a portion higher than the embedded region of the active groove, the active groove filled region is provided on a bottom surface of the active groove, and an upper portion of the active groove filled region is formed higher than a surface of the base region.

6. The semiconductor device according to claim 1, further comprising a field insulating film provided on the conductive layer,
wherein an upper portion of the active groove is positioned inside the filed insulating film, and an upper portion of the active groove filled region is positioned inside the active groove inside the field insulating film.

7. The semiconductor device according to claim 1, further comprising a plurality of ring-shaped guard grooves that concentrically surround the gate groove and are separated by a predetermined spacing, and a guard groove filled region of the second conductivity type provided inside the guard groove.

8. The semiconductor device according to claim 6, further comprising a plurality of ring-shaped guard grooves that concentrically surround the gate groove and are separated by a predetermined spacing, and a guard groove filled region of a second conductivity type provided inside the guard groove,
wherein an upper portion of the guard groove is positioned inside the field insulating film, and an upper portion of the guard groove filled region is positioned inside the guard groove inside the filed insulating film.

9. A semiconductor device, comprising:
a processed substrate having a conductive layer of a first conductivity type;
a field insulating film provided on the conductive layer;
a base region of a second conductivity type formed at an inner surface of the conductive layer;
an active groove formed in a position in which the base region of the conductive layer is provided, and the active groove whose bottom portion is formed deeper than a bottom surface of the base region and whose upper portion is positioned inside the field insulating film;
an embedded region of the second conductivity type provided on a bottom surface of the active groove and whose upper end portion is lower than the base region;
a gate groove structured by a portion higher than the embedded region of the active groove;
a gate insulating film provided at a side surface of the gate groove;
a gate electrode plug provided inside the gate groove and being in contact with the gate insulating film;
a source region of the first conductivity type provided in a position in contact with the gate insulating film within the base region, the source region being separated from the conductive layer by the base region;
a source electrode film in contact with the source region;
an active groove filled region of the second conductivity type in contact with the embedded region, whose upper end is higher than a surface of the conductive layer, and being electrically shorted with the source electrode film,
a plurality of ring-shaped guard grooves that concentrically surround the active groove and are separated by a predetermined spacing and whose upper portions are respectively positioned inside the field insulating film; and
a guard groove filled region of the second conductivity type provided inside the guard groove and whose upper end is higher than a surface of the conductive layer.

10. The semiconductor device according to claim 1, wherein a drain electrode film connected to the conductive layer is provided on a back surface of the processed substrate.

11. The semiconductor device according to claim 1, wherein a collector layer of the second conductivity type in contact with the conductive layer and a collector electrode film electrically connected to the collector layer are provided on a back surface of the processed substrate.

12. The semiconductor device according to claim 1, wherein a Schottky electrode film that forms a Schottky junction with the conductive layer is provided on a back surface of the processed substrate.

* * * * *